(12) United States Patent
Gafri

(10) Patent No.: US 10,183,880 B2
(45) Date of Patent: Jan. 22, 2019

(54) WASTEWATER TREATMENT PLANT AND METHOD FOR TREATMENT OF WASTE SLUDGE

(71) Applicant: WADIS Ltd., Nes Ziona (IL)

(72) Inventor: Oren Gafri, Rishon Le-Zion (IL)

(73) Assignee: WADIS LTD., Nes Ziona (IL)

( * ) Notice: Subject to any disclaimer, the term of this patent is extended or adjusted under 35 U.S.C. 154(b) by 523 days.

(21) Appl. No.: 14/959,100

(22) Filed: Dec. 4, 2015

(65) Prior Publication Data

US 2016/0159673 A1    Jun. 9, 2016

Related U.S. Application Data

(63) Continuation-in-part of application No. 13/980,734, filed as application No. PCT/IL2012/050013 on Jan. 19, 2012, now Pat. No. 9,233,858.

(30) Foreign Application Priority Data

Jan. 23, 2011 (IL) .......................................... 210808
May 5, 2011 (IL) .......................................... 212693

(51) Int. Cl.
| | |
|---|---|
| C02F 9/00 | (2006.01) |
| C02F 1/46 | (2006.01) |
| C02F 3/00 | (2006.01) |
| C02F 1/00 | (2006.01) |
| C02F 3/30 | (2006.01) |
| B01J 19/08 | (2006.01) |
| C02F 11/00 | (2006.01) |

(Continued)

(52) U.S. Cl.
CPC .............. *C02F 9/00* (2013.01); *B01J 19/087* (2013.01); *B01J 19/088* (2013.01); *C02F 1/4608* (2013.01); *C02F 11/006* (2013.01); *B01J 2219/0809* (2013.01); *B01J 2219/0847* (2013.01); *B01J 2219/0877* (2013.01); *B01J 2219/1942* (2013.01); *B01J 2219/1947* (2013.01); *C02F 3/12* (2013.01); *C02F 11/04* (2013.01); *C02F 2201/46175* (2013.01); (Continued)

(58) Field of Classification Search
None
See application file for complete search history.

(56) References Cited

U.S. PATENT DOCUMENTS

| | | | |
|---|---|---|---|
| 3,366,564 | A | 1/1968 | Merton |
| 3,402,120 | A | 9/1968 | Merton et al. |

(Continued)

FOREIGN PATENT DOCUMENTS

| | | |
|---|---|---|
| CN | 2832800 Y | 11/2006 |
| CN | 201532229 U | 7/2010 |

(Continued)

OTHER PUBLICATIONS

Shen et al.,"Effect of various gases and chemical catalysts on phenol degradation pathways by pulsed electrical discharges" Journal of Hazardous Materials, Elsevier, pp. 713-722 ,vol. 150, No. 3, 16 (Jan. 2008).

*Primary Examiner* — Kishor Mayekar
(74) *Attorney, Agent, or Firm* — Browdy and Neimark, PLLC

(57) ABSTRACT

A wastewater plant and method for treatment of wastewater sludge or other wastewater fluids are described. The wastewater plant utilizes an electrical discharge system configured for receiving a wastewater fluid, and generating a transient voltage and arcing electric current pulse through the received wastewater fluid to create an electro-hydraulic shock wave within the wastewater fluid accompanied by a high electric field, intensive heat and light radiation.

28 Claims, 16 Drawing Sheets

(51) Int. Cl.
  *H03K 3/53* (2006.01)
  *H03K 3/537* (2006.01)
  *H03K 3/57* (2006.01)
  *C02F 11/04* (2006.01)
  *C02F 3/12* (2006.01)

(52) U.S. Cl.
  CPC ...... *C02F 2303/04* (2013.01); *C02F 2303/06* (2013.01); *H03K 3/53* (2013.01); *H03K 3/537* (2013.01); *H03K 3/57* (2013.01); *Y02W 10/15* (2015.05)

(56) References Cited

U.S. PATENT DOCUMENTS

| | | |
|---|---|---|
| 4,957,606 A | 9/1990 | Juvan |
| 5,397,961 A | 3/1995 | Ayers |
| 6,030,538 A | 2/2000 | Held et al. |
| 6,093,432 A | 7/2000 | Mittal |
| 6,327,163 B1 | 12/2001 | Petr |
| 6,491,820 B2 | 12/2002 | Held et al. |
| 6,540,919 B2 | 4/2003 | Held et al. |
| 6,709,594 B2 | 3/2004 | Held et al. |
| 7,001,520 B2 | 2/2006 | Held et al. |
| 8,110,155 B2 | 2/2012 | Fridman et al. |
| 2006/0002050 A1 | 1/2006 | Kichline, Jr. |
| 2010/0108588 A1 | 5/2010 | Gallagher et al. |
| 2012/0024718 A1 | 2/2012 | Foret |

FOREIGN PATENT DOCUMENTS

| | | |
|---|---|---|
| EP | 2153851 A1 | 2/2010 |
| EP | 2 665 684 | 11/2013 |
| WO | 2010058401 A2 | 5/2010 |
| WO | 2012/098549 | 7/2012 |

WASTEWATER TREATMENT PLANT AND METHOD FOR TREATMENT OF WASTE SLUDGE

FIELD OF THE INVENTION

This invention relates to systems and methods for the treatment of liquids, sludge or other wastewater fluids with high bacterial and/or organic content such as municipal waste sludge, agricultural waste sludge, livestock waste sludge, industrial waste sludge, waste activated sludge and others, and more particularly to a wastewater treatment plant and method for the treatment of wastewater fluids by using high-energy electrical discharge.

BACKGROUND OF THE INVENTION

Harmful materials and pathogens found in wastewater fluids, including wastewater, wastewater sludge and waste activates sludge can present a significant risk to the environment and to human health if left untreated. Accordingly, various organic, inorganic, chemical, and microbial components of wastewater fluids must be treated before waste products may be discharged to the environment. Examples of such wastewater fluids include industrial waste sludge, municipal wastewater, chemical processing effluent, paper mill effluent, livestock waste, etc. Treatment of these wastewater fluids is usually carried out in Waste-Water Treatment Plants (WWTPs).

Referring to FIG. 1, a schematic view of treating municipal wastewater fluid in a prior art wastewater treatment plant (WWTP) 100 is illustrated. Wastewater fluid can flow first into a preliminary treatment station 102. The preliminary treatment station 102 may include one or more screens (not shown), which can, for example, be large metal grates that prevent larger objects (trash, grit, sand, etc) in the wastewater fluid stream from passing further downstream.

After the wastewater fluid stream passes through the preliminary treatment station 102, the wastewater influent enters a primary settling clarifier 103 of the WWTP 100 where raw sludge (also referred to as primary sludge (PS)) is separated from the wastewater via flocculation, sedimentation, and other primary settling techniques.

The remaining wastewater fraction (separated from the primary sludge) that is discharged from the primary clarifier 103 still contains a relatively high concentration of suspended bio-solids and dissolved bio-waste, nitrates, phosphates, etc. This wastewater fraction, which is also referred to as primary effluent, is directed to one or more aeration tanks 104, where aerobic microorganisms treat the wastewater in the presence of air that is pumped into the aeration tank 104 to produce an aerated wastewater effluent.

It should be noted that some WWTPs forgo the stages of treatment on the preliminary treatment station 102, and on the primary settling clarifier 103, and the wastewater fluid stream in its entirety is transferred to one or more aeration tanks 104. The action of bacteria in the aeration tank(s) 104 is to reduce the phosphates, nitrates and dissolved or suspended bio-waste.

The aerated wastewater effluent leaving the aeration tank 104 is referred to as activated sludge (AS). The AS is transferred to a secondary settling clarifier 105, where further settling can occur. The wastewater fluid leaving the secondary clarifier 105 has two fractions, such as a fraction containing a higher percentage of bio-solids (microbial matter), and a fraction containing a lower percentage of bio-solids.

The wastewater fluid fraction leaving the secondary clarifier 105 and containing a higher percentage of bio-solids is referred to as waste activated sludge (WAS) or as secondary sludge. Some of the secondary sludge is usually returned to the aeration tank 104 to help perpetuate the aerobic biodegradation process. This secondary sludge is referred to as return activated sludge (RAS).

The WAS from the secondary clarifier 105 and the primary sludge (raw sludge) from the primary clarifier 103 are transported to an anaerobic digester 106.

When desired, the waste activated sludge from the secondary clarifier 105 and the primary sludge from the primary clarifier 103 may be passed through primary and secondary thickeners 107 and 108, correspondingly, where access water can be removed from WAS to increase the solid content. The access water can, for example, be removed by adding chemicals, such as polymers in combination with trivalent iron or lime. Likewise, such actions such as straining, floating, or gravity settling can also be used for removing access water.

The thickened primary sludge and the thickened waste activated sludge may be passed along to the anaerobic digester 106 for about 15-21 days. In the anaerobic digester 106, the primary sludge and waste activated sludge are exposed to microorganisms in an oxygen-poor environment for anaerobic digestion that further degrade the sludge biologically by subjecting them to anaerobic fermentation to yield by-product gases, such as methane ($CH_4$), carbon dioxide ($CO_2$), hydrogen sulfide ($H_2S$) and ammonia ($NH_3$).

At least two product streams may exit the anaerobic digester 106. A first product stream contains by-product gases $CH_4$, $CO_2$, $H_2S$ and $NH_3$, and a second stream contains digested sludge which is also referred to as digestate, that contains digested solids, microbiological processors, and also liquid fraction. It should be noted that although methane may represent energy resources and may be gathered and used, other by-product gases emit bad odors, cause pollution, and are corrosives.

The digestate is transferred to a dewatering system 109 where the sludge exiting the anaerobic digester 106 is subjected to pressure for dewatering to further separate liquids from the bio-solids to create a "dry" solid material, in the form of a sludge cake or a sludge powder. The "dry" solid material can be carted away as expellant, while the liquid fraction may be reclaimed and returned to the aeration tank 104.

The dewatering system may include filter press 109a, belt press 109b or centrifuge 109c. Moreover, adding chemicals, such as polymers and flocculants is usually used to aid the dewatering process.

Due to the physical nature of the digestate being composed of spongy and/or closed cells, The water content in the "dry" expellant after the conventional dewatering treatment can still be around 80 weight percent or even higher, resulting in a large expellant volume. The expellant also has a high risk of containing harmful pathogens and parasites, so it must be made inert by boiling, burning, or composting to high acidity.

The expellant from the WWPT is evacuated and transported to an incinerator plant or a composting farm (not shown). Incineration is usually difficult due to high water content. It requires a large amount of fuel and leave ashes that still must be disposed of. Moreover, incineration produces high carbon emissions.

At a composting farm, it usually takes several weeks for the sludge cake to become inert and safe for use as a fertilizer or for its disposal in a landfill.

It is known in the art that the majority of the water contained in municipal waste-water sludge is "bound" water which is contained within and between molecular cells. Molecular cells in the sludge can be presented in waste-water sludge as individual cellular units or as cellular units assembled in flocs. The water molecules contained within the cell, for purposes of this application, are referred to as "intra-cellular" water molecules, while the water molecules between the cells and bound thereat via both mechanical and electrical bonding, are referred to as "intercellular" water molecules. When sludge exiting the anaerobic digester 106 is treated at a municipal treatment plant by conventional dewatering belt presses and/or centrifuge methods, intra-cellular and intercellular water is not completely released.

Techniques for dewatering and reduction of volume and weight of WAS sludge are described in U.S. Pat. Nos. 6,491,820; 6,540,919; 6,709,594 and 7,001,520. These references describe systems and methods for treatment of biologically-active waste-water sludge by a pulsed electric-field system which applies non-arcing high voltages to sludge. The pulsed electric-field provides electroporation of the sludge, causing disruption of the cellular structure and breaking down intra-cellular and intercellular molecular bonds of WAS sludge. As a result, intra-cellular and inter-cellular water is released from the WAS sludge. After releasing the intra-cellular and intercellular water, the organic solid contents, suspended in solution, are reduced in volume and mass, which can simplify sludge post-treatment processes. Moreover, the electroporated sludge can be directed to bioreactors, such as aerobic, anoxic or anaerobic, for performing biological digestion, where the electroporated sludge can be used as food for the microorganisms participating in the biological digestion.

The wastewater fluid fraction leaving the secondary clarifier 105 and containing a lower percentage of bio-solids is referred to as secondary wastewater effluent. The secondary wastewater effluent can be heavily polluted and contain pathogenic bacteria and viruses. In order to provide subsequent purification, the secondary effluent is transported to a final treatment station 120. The final treatment station 120 may, for example, include chemical disinfection by chlorine, hydrogen peroxide, ozone etc. Likewise, it may involve the use of ultra-violet (UV) light to destroy the pathogens. These disinfection processes may be concurrent or consecutive.

The resultant flow may then be directed to the filtration station 121. The filtration station 121 is an optional station, and may be included or omitted depending upon the use for which the resultant treated water is intended. One or more filters, such as sand or crushed coal filters, may be used to remove impurities remaining in the treated water stream. Bio-solids collected on the filters may be removed, for example, by backwashing the filters, and directed to the anaerobic digester 106. The resulting water stream, that is referred to as tertiary effluent, may be discharged into a river, lake or ocean, or put to an alternative use, such as for irrigation or for industrial processes.

The disinfection of wastewater effluent has been historically accomplished through the addition of chlorine compounds. There are major health and safety concerns associated with handling chlorine compounds. In recent years, there have been increased concerns that chlorine can combine with organic material in the effluent to produce chlorinated organics, which are both toxic and potentially carcinogenic. Although some efforts are being made to substitute less toxic chlorine compounds, there is an industry-wide trend towards phasing out the use of chlorine as a disinfectant agent.

Other disinfection technologies employed in wastewater treatment, that involve the use of ultra-violet (UV) light or ozone, are relatively costly. The effect of these techniques is short-lived, so that pathogen re-growth can occur, compared to longer-lasting chlorines. In the case of a UV process, the capital costs include the construction of the flow-through mechanism, and the multiple UV bulbs (lamps) that are required. The operating costs include power, timely replacement of bulbs, and regular cleaning of the bulbs. Major costs for disinfecting with ozone include the ozone generator and commercial oxygen, which is used as the feed source. When air is used as the feed source, the size of the ozone generator must be approximately doubled, therefore doubling the capital cost.

A technique known in the art, usually under the name "electro-hydraulics", utilizes arcing high-energy electrical discharge into a volume of liquid or slurries or other fluid for the purpose of disinfecting, changing chemical constituents and recovering metals and other substances from the fluids (see, for example, U.S. Pat. No. 3,366,564 to Allen; U.S. Pat. No. 3,402,120 to Allen et al.; and U.S. Pat. No. 4,957,606 to Juvan).

According to this technique, an electro-hydraulic shock wave within the liquid or slurries, intensive light radiation and thermo-chemical reactions are initiated by arc discharge into a spark gap formed by the electrodes immersed in such fluids.

FIG. 2 shows an electric scheme of a typical prior art system 10 for treatment of wastewater sludge or other contaminated fluid by utilizing high-energy arcing electrical discharge. The apparatus 10 includes a high-voltage supply device 11 having a rectifier (not shown) coupled to a high voltage capacitor bank 12 that comprises one or more capacitors. The coupling of high-voltage supply device 11 to the capacitor bank 12 can, for example, be a direct "galvanic" connection.

Alternatively, as is explained below, the connection can be through a resistive element and/or a switching element. The supply device 11 and the high voltage capacitor bank 12 form together a charge circuit A.

The system 10 also includes a high current switch 13 in series with the capacitor bank 12 and a pair of electrodes 14*a* and 14*b* separated by a gap in series with high current switch 13. In operation, the electrodes 14*a* and 14*b* are immersed in a liquid 15 for providing an electric discharge in the gap therebetween within the liquid. The capacitor bank 12, together with the high current switch 13, the electrodes 14*a* and 14*b*, and all interconnection cables therebetween form a discharge circuit B. For safety reasons, one of the terminals of the high-voltage supply device 11 (for example, which is connected to the electrode 14*b*) is permanently grounded. When desired, only one of the electrodes (14*a* in FIG. 1) is immersed in the liquid 16 under treatment, whereas the second electrode (14*b* in FIG. 1) can be coupled to or associated with a conductive body of the treatment vessel 16 holding the liquid 15.

In operation, the capacitor bank 12 is charged by the voltage supply device 11. During charging of the capacitor bank 12, the high current switch 13 is open. After charging, the capacitor bank 12 can be discharged by closing the switch 13, in order to supply a high voltage to the electrodes 14*a* and 14*b*, and thereby generate an electric current pulse therebetween through the liquid under treatment. The closing of the high current switch 13 is usually activated by an ignition circuit (not shown) launching an ignition electric pulse to the switch 13.

Despite its apparent simplicity, the system 10 suffers from a number of limitations. In particular, the current charging the capacitor bank 12 has the form of an attenuated exponent. Accordingly, the charging current is high only at the very beginning of the charging process, and then the charging current decreases over time. As a result, the power supply efficiency is low.

Another drawback is associated with the fact that the submerged electrodes 14a and 14b are subjected to damage from the pressure wave and to the electrical erosion produced by the arcing current. Thus, the electrodes 14a and 14b must be either massive or frequently replaced.

Moreover, a large portion of the discharge current is lost in ionizing the liquid before any arcing can occur. Thus, with massive, robust electrodes having large surface areas, the loss in ionizing can consume nearly all of the stored capacitor energy, resulting in generation of only a week arc, or no arc at all, thus making the hydraulic shock insufficient for the desired purpose.

Another drawback is associated with transient current behavior in the discharge circuit B. Since the discharge circuit B represents a series RLC circuit, the transient response of the circuit B depends on the damping factor $\zeta$ that is given by $$\zeta = \frac{R}{2}\sqrt{\frac{C}{L}},$$

where C is the capacitance (in Farads) of the capacitor bank 12, L is the inductance (in Henrys) and R is the resistance (in Ohms) of the discharge circuit B.

The current behavior i(t) during a transient response for different $\zeta$ is shown in FIG. 3A. As can be seen, this behavior depends on the value of $\zeta$. In particular, when $\zeta<1$ (the under-damped response, curves 21-23), the transient current decays with oscillation. On the other hand, transient current decays without oscillations occur when the $\zeta \geq 1$ (the critically damped response, shown as curve 24, and over-damped response, shown as curve 25).

High values of L prevent the current from rising fast, making a larger portion of the stored charge be lost before an arc forms. On the other hand, large values of R limit the value that the current may rise to, and thereby the power of the arc when it forms (an over-damped system response, with $\zeta>1$, shown as curve 25, or critically damped response, shown as curve 24). However, low value of R may result in an under-damped response, with $\zeta<1$, (curves 21-23), that produces polarity reversal in the discharge circuit B, as transient current decays with oscillation.

In the case of oscillating current decays, the negative reverse components $I_R$ of the oscillating transient current i(t) can either over-deplete and then reversely charge the capacitor bank 12, thereby producing a reverse voltage of high amplitude across the capacitor bank 12, or draw the corresponding reverse discharge current through the high-voltage supply device 11, thereby damaging it.

In order to decrease the reverse current of the electric discharge through the high-voltage supply device 11, a current limiting resistor 17 is usually included into this chain between the capacitor bank 12 and the voltage supply device 11 for limiting the discharge current drawn by reversed polarity during discharge. Although this provision enables protection of the voltage supply device 11 from damage, it results in electric losses in the resistor 17, reduced charging current, reduced efficiency and extra expenses.

GENERAL DESCRIPTION

There is still a need in the art for, and it would be useful to have, a novel system and method for treatment of wastewater fluids, such as activated sludge (WAS) and other contaminated liquids. The technique should be sufficiently reliable and efficient for implementation at a wastewater plant for treatment of wastewater sludge and other wastewater fluids by application of a high-energy arcing electrical discharge to the sludge or other wastewater fluid at various treatment stages.

It would be advantageous to have a novel system and method that can be sufficiently reliable and efficient for treatment of primary sludge to remove contaminating and toxic organic and inorganic compounds.

It would be most advantageous to have a novel system and method that can be sufficiently reliable and efficient for treatment of activated sludge via destructing most of the individual cellular units and the cellular units assembled in flocs in the WAS. In this case, the high-energy arcing electrical discharge should have power sufficient for electroporating (or lysing) the waste activated sludge to cause disruption of the cellular structure and breaking down intracellular and intercellular molecular bonds, and thereby facilitating release of intra-cellular nutrients as well as intra-cellular and intercellular water from the sludge. The cell membrane destruction may facilitate a faster or more efficient digestion of the WAS in existing digesters.

It would be advantageous to have a novel system and method that can be employed for treatment of digested sludge in combination with other conventional dewatering techniques in order to provide the wastewater treatment plant with a cost-effective and efficient system.

Furthermore, it would be advantageous to have a technique that can be employed for decontamination of second wastewater effluent to destroy or remove contaminating and toxic materials; substances which produce color, taste and odor; pathogenic bacteria; and harmful suspended materials.

Likewise, it would be advantageous to have a technique that can be employed for treatment of groundwater and drinking water to destroy or remove pathogenic bacteria, and substances which produce color, taste and odor.

The fluid under treatment can be either a still fluid or a running fluid. In other words, the fluid under treatment can be placed in the reactor vessel, stirred in the vessel, or pumped and flowed through the vessel.

The present invention partially eliminates disadvantages of conventional techniques and provides a novel Wastewater Treatment Plant (WWTP). For treatment of wastewater sludge or other wastewater fluids, the WWTP utilizes an electrical discharge system providing high-energy glow-to-arcing electrical discharge through the fluid in order to produce several disinfection and lysing processes within the treated fluid. The electrical discharge system of the present invention partially overcomes the disadvantages of prior art electrical discharge systems used for treatment of contaminated liquids, and can be implemented at various places of the WWTP corresponding to various stages of the treatment process.

According to an embodiment, the WWTP of the present invention maintains original configuration of prior art WWTPs, but further includes one or more electrical discharge systems arranged in key junctions of the treatment process. Thus, the WTTP includes a preliminary treatment station, configured for receiving a wastewater fluid and screening thereof to prevent larger objects from passing further downstream. The WWTP also includes a primary settling clarifier arranged downstream of the preliminary treatment station. The primary settling clarifier is configured for receiving the wastewater fluid leaving the preliminary treatment station, and separating it into a primary sludge and a primary effluent. The WWTP also includes an aeration tank configured for receiving the primary effluent leaving the primary settling clarifier, and for treating the primary effluent in the presence of air pumped into the aeration tank, thereby to produce an aerated wastewater effluent. The WWTP also includes a secondary settling clarifier arranged downstream of the aeration tank. The secondary settling clarifier is configured for receiving the aerated wastewater effluent leaving the aeration tank, and for separating the aerated wastewater effluent into waste activated sludge and secondary wastewater effluent.

The WWTP also includes an electrical discharge system and an anaerobic digester. According to an embodiment, the anaerobic digester is arranged downstream of the electrical discharge system. The anaerobic digester is configured for receiving the wastewater fluid treated by the electrical discharge system and further degrading it by anaerobic digestion, thereby to provide by-product gases and digestate. When desired, the primary sludge can also be received by the same or by a separate anaerobic digester.

According to an embodiment of the present invention, the electrical discharge system is configured (i) for receiving at least a part of the primary sludge and/or the waste activated sludge, and (ii) generating a transient glow-to-arc electric current pulse through the received wastewater fluid. The transient glow-to-arc electric current pulse through the received wastewater fluid creates an electro-hydraulic shock wave within the fluid accompanied by intensive heat and light radiation, shock interference sonication, cavitation, shock decompression, and induced currents. Accordingly, several electrical field-driven and arc-driven phenomena can occur in the fluid, such as strong electric field local ionization, electroporation, molecular stretching, molecular activation, hydrolysis, hydroxyl ($OH^-$) formation, ozone ($O_3$) formation, Ionized Hydrogen proton ($H^+$) formation, and electron cascades.

According to an embodiment, the electrical discharge system comprises a high voltage supply device having a potential terminal and a ground terminal, a general capacitor bank coupled to the high voltage supply device, and at least one general switch connected to the general capacitor bank. The general capacitor bank can be coupled to the high voltage supply device either directly or through a resistor link.

The system also comprises one or more pulse forming banks (which are also referred to as "working capacitor banks"), coupled to the general capacitor bank through the general switch, and one or more working switches, each arranged in series with the corresponding pulse forming bank. The system further comprises one or more potential electrodes immersed in the liquid under treatment, which are coupled to the corresponding pulse forming banks through the corresponding working switches. The system also comprises at least one grounded electrode, defining, together with the potential electrodes, a gap within the liquid arranged in series with the working switch, for providing an electric discharge through a portion of the liquid in the gap.

According to an embodiment of the invention, the pulse forming banks may be a high voltage fast discharge capacitor or a bank including several capacitors. According to another embodiment of the invention, the pulse forming bank can include a pulse-forming network including a plurality of capacitors, inductors, and/or delay lines.

According to an embodiment of the invention, an electrical capacity of the general capacitor bank is greater than the electrical capacity of the pulse forming banks.

According to an embodiment of the invention, an electrical charging of the pulse forming banks is carried out by charge transfer from the general capacitor bank after closing of the general switch. The electrical capacity of the general capacitor bank is greater than that of the pulse forming banks, which ensures that its voltage remains positive, even after fully charging the pulse forming bank that has reversed polarity.

According to an embodiment of the invention, the pulse forming banks are separated from each other by a current resistive element. For example, the current resistive element can be arranged in the potential electric line and coupled to the potential terminal of the high-voltage supply device in series through the general switch. Alternatively, the current resistive element can be arranged in the grounded electric line.

Likewise, the pulse forming banks can be separated from each other by one or more inductive elements or by a combination of resistive inductive elements.

According to an embodiment of the invention, the grounded electrode is associated with a grounded conductive body of a treatment vessel holding the liquid.

According to one embodiment of the invention, the general switch and the working switches are high current switches. For example, the general switch and the working switches can be three electrode spark-gap switches including two switching electrodes forming the switching paths and a trigger electrode configured for enabling passage of high current between the two switching electrodes.

According to another embodiment of the invention, the working switches are semiconductor high current switches.

According to another embodiment of the invention, the working switches are mechanical cam or toggle high current switches with high closing speed.

According to a still another embodiment of the invention, the electrical discharge system further comprises one or more additional general switches connected to the general capacitor bank, one or more additional pulse forming banks, each bank having a grounded terminal and potential terminal, each bank coupled to the general capacitor bank through the corresponding additional general switches. In this embodiment, the system also has one or more additional working switches arranged in series with and between the potential terminal of the corresponding additional pulse forming banks and the corresponding electrodes that are immersed into the liquid under treatment.

According to an embodiment of the invention, the additional pulse forming banks are separated from each other by an additional current resistive and/or inductive elements arranged in the potential power line. This serves to decouple the pulse forming banks during the momentary (transient) pulse discharge, by preventing current or charge transfer between the banks, yet allows a current path for longer-time processes such as the charging to voltage, trickle charging to maintain voltage, top-off charging to voltage beyond the initial charge through the working switch, or de-energizing after use when the general switches are open.

According to an embodiment of the invention, an additional electrical capacity $C_{add}$ is provided by an additional capacitor bank having $C_{add}$ greater than the electrical capacitance $C_w$ of the pulse forming bank, but less than the capacitance $C_g$ of the general capacitor bank.

According to one embodiment of the invention, all the pulse forming banks have the same value of electric capacitance.

According to another embodiment of the invention, electric capacitance values of the pulse forming banks have different values, making for different discharges in different locations.

According to an embodiment of the invention, the electrical discharge system comprises a treatment vessel containing the liquid under treatment and equipped with one or more pairs of the potential and grounded electrodes positioned to form a gap for transferring a glow-to-arc electric current pulse through the liquid under treatment.

According to an embodiment of the invention, the treatment vessel includes an internal reflector that can be shaped and configured to form an oscillating or resonating chamber that can reflect, direct and resonate hydraulic shock waves in order to achieve interference of reflected shock front waves, thus forming staggered wave pulses intersecting with their own reflections. Due to such a resonance effect, a glow-to-arc discharge can be obtained through the liquid under treatment.

According to another embodiment of the invention, the reaction vessel the reaction vessel treatment vessel includes an internal reflector that can be shaped to form an acoustic guide to achieve interference of shock fronts from simultaneous pulses in properly distanced locations intersecting with each other.

According to an embodiment of the invention, the internal reflector has an ellipsoidal shape. According to this embodiment, the arcing spark gap is located at least in one focal node of the ellipsoidal reflector.

According to an embodiment of the invention, the internal reflector has a spheroidal shape. According to this embodiment, the arcing spark gap is located at least in one position on a circle passing through focal nodes of the spheroidal reflector around a spheroid axis.

According to an embodiment of the invention, the internal reflector has a cylindrical tubular shape. According to this embodiment, the arcing spark gap is located on a longitudinal tube axis of the cylindrical reflector.

According to an embodiment of the invention, the internal reflector has a cylindrical tubular shape. According to this embodiment, the arcing spark gap is located on a helix turning around a longitudinal tube axis of the cylindrical reflector.

According to an embodiment of the invention, the internal reflector has an elliptical tubular shape. According to this embodiment, the arcing spark gap is located along an axis formed by focal nodes of the elliptical reflector.

According to an embodiment of the invention, the treatment vessel comprises at least one internal optic device including a reflector. According to this embodiment, the internal optic device is configured to at least one of the following: to direct, to split, and to focus said hydraulic shock waves.

According to an embodiment of the invention, the treatment vessel includes an inlet gas manifold, a blower fan providing a flow of air or a gas mixture containing oxygen to pass through the manifold, and a nozzle arranged at an end of the inlet gas manifold, and configured for allowing a gas stream to be mixed with the wastewater stream.

The electrical discharge system according to the present invention may be easily and efficiently fabricated and marketed.

The electrical discharge system according to the present invention is of durable and reliable construction.

The electrical discharge system according to the present invention may have a low manufacturing cost.

According to an embodiment of the invention, the WWTP may further include one or more other electrical discharge systems arranged at a number of different junctions within said plant.

According to one example, the WWTP may include an electrical discharge system arranged upstream of the primary treatment station and configured for receiving and treating a wastewater fluid and providing it, after treatment, to the preliminary treatment station.

According to another example, the WWTP may include an electrical discharge system configured for receiving and treating at least a part of the primary sludge leaving the primary settling clarifier before it enters the anaerobic digester.

According to a further example, the WWTP may include an electrical discharge system configured for receiving and treating at least a part of the waste activated sludge (WAS) stream leaving the secondary settling clarifier before it enters the anaerobic digester.

According to still another example, the WWTP may include an electrical discharge system configured for receiving and treating at least a part of the digestate stream leaving the digester on the way to the dewatering station.

According to yet another example, the WWTP may include an electrical discharge system configured for receiving and treating a stream of the secondary and/or tertiary wastewater effluent.

According to an embodiment, the generating of the transient arcing electric current pulse by the electrical discharge system begins by placing the general switch and the working switches in the switched off position. The generating of the transient arcing electric current pulse further includes charging the general capacitor bank by connecting to the voltage supply device, switching on the general switch to supply a high voltage to the pulse forming bank(s) for charging thereof by partially discharging the general capacitor bank, switching off the general switch and then switching on the working switches, thereby discharging the pulse forming bank(s) and generating a transient electric current pulse between the potential electrode(s) and the grounded electrode(s).

According to one embodiment of the invention, the generating of the transient arcing electric current pulse comprises the step of simultaneous switching on the working switches to provide a simultaneous electric discharge of the pulse forming banks through the contaminated liquid between the potential electrodes and the grounded electrodes.

According to one embodiment of the invention, the generating of the transient arcing electric current pulse comprises switching on the working switches in accordance with a predetermined algorithm.

According to still a further embodiment of the invention, the generating of the transient arcing electric current pulse forgoes the step of switching off the general switch to break the connection between the general capacitor bank and the pulse forming banks before the step of switching on the working switches, and, instead of, or in addition to the general switch, uses a current-limiting element in series from general capacitor bank to pulse forming bank, which prevents the transient pulse discharge from affecting the general capacitor.

According to a further embodiment of the invention, the generating of the transient arcing electric current pulse further comprises switching on the additional general switch to supply a high voltage to the additional pulse forming banks for charging thereof by further partial discharging the general capacitor bank, and switching on the additional working switches to provide discharge of the additional pulse forming banks and thereby to maintain transient electric current between the corresponding potential electrode and the grounded electrode.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

In order to understand the invention and to see how it may be carried out in practice, preferred embodiments will now be described, by way of non-limiting example only, with reference to the accompanying drawings, in which.

DETAILED DESCRIPTION OF EMBODIMENTS

Figure 1:
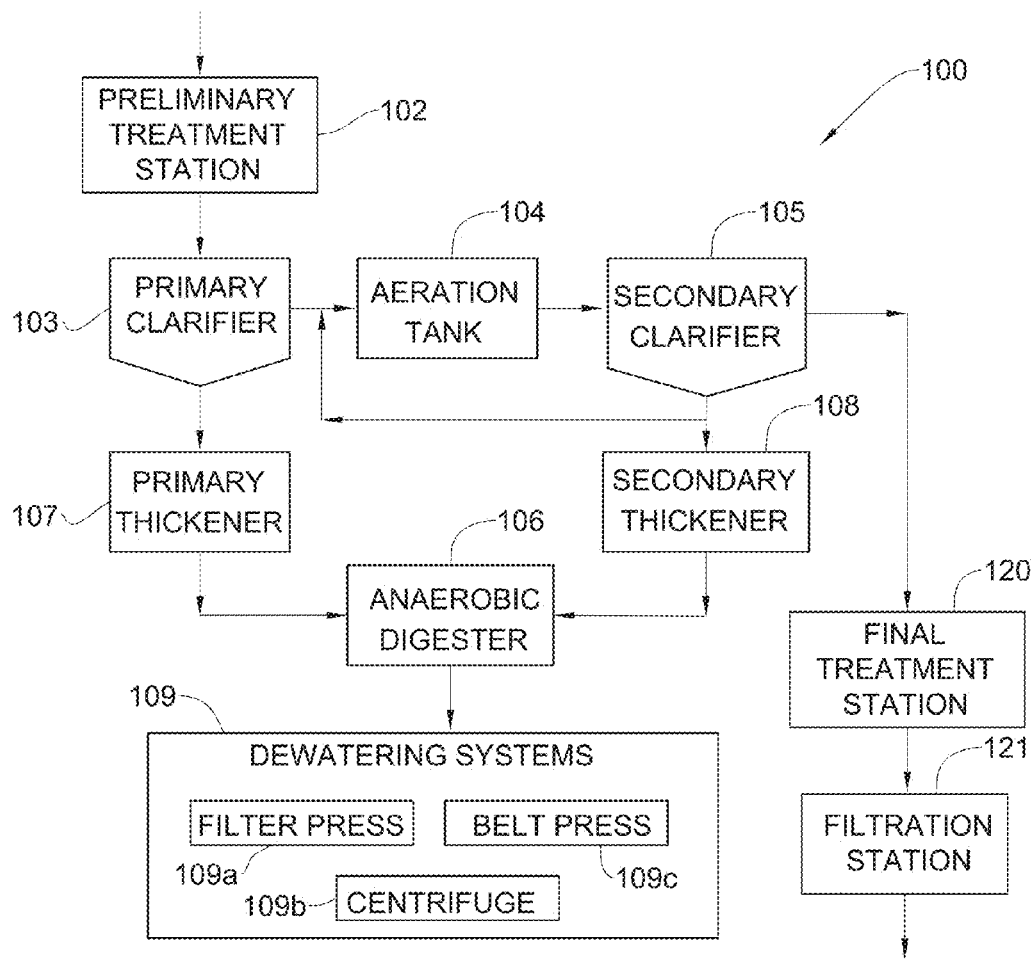
FIG. 1 is a schematic view of treating municipal wastewater sludge in a prior art wastewater plant (WWTP)

The principles and operation of the system for treatment of contaminated liquid according to the present invention may be better understood with reference to the drawings and the accompanying description, wherein like reference numerals have been used throughout to designate identical elements, where it is convenient for description. It should be understood that these drawings, which are not necessarily to scale, are given for illustrative purposes only, and are not intended to limit the scope of the invention. Examples of constructions are provided for selected elements. Those versed in the art should appreciate that many of the examples provided have suitable alternatives which may be utilized.

Figure 2:
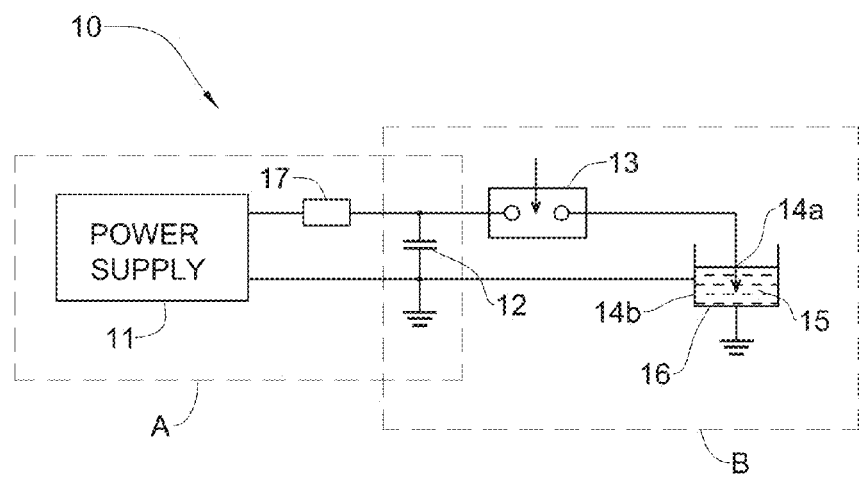
FIG. 2 is an electric scheme of an exemplary prior art system for treatment of contaminated liquid.
Figure 3A:
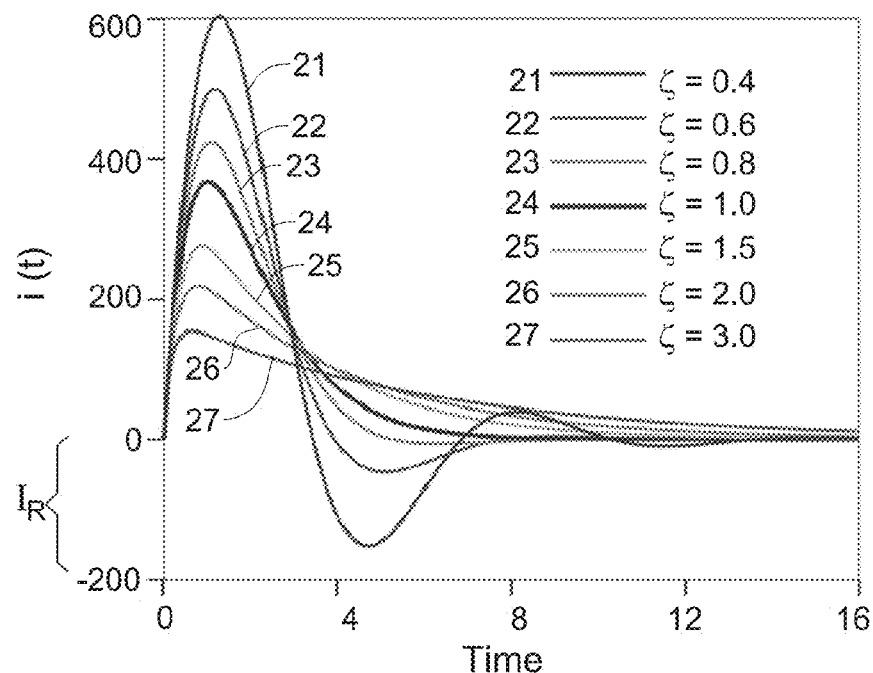
FIG. 3A illustrates transient current behavior of a series RLC circuit for different values of the damping factor.
Figure 3B:
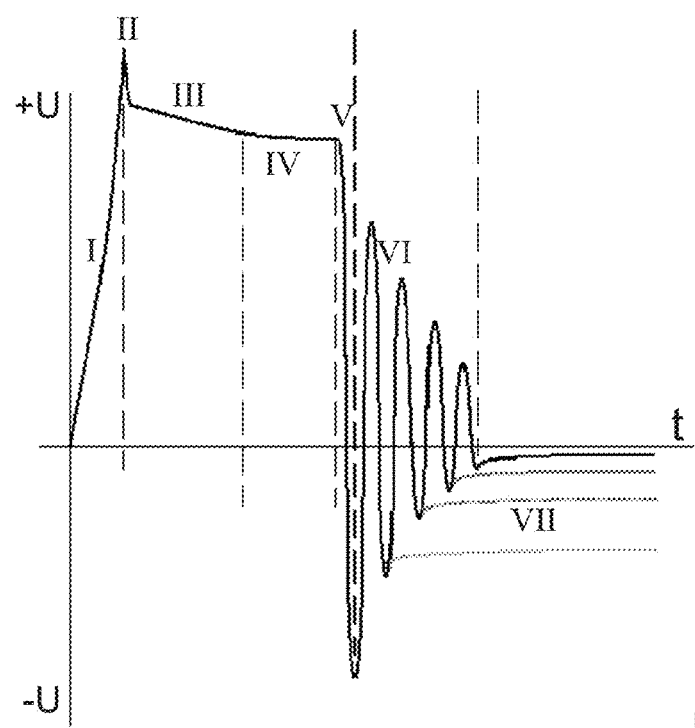
FIG. 3B illustrates the voltage and current behavior of Glow-to-Arc discharges.

The electric scheme of the prior art system 10 shown in FIG. 2 for treatment of a contaminated fluid, such as waste sludge or other contaminated liquid, and for the electric discharge current behavior shown in FIGS. 3A and 3B have already been described in the background section, so further detailed discussion of this electric scheme is considered unnecessary here.

Figure 4A:
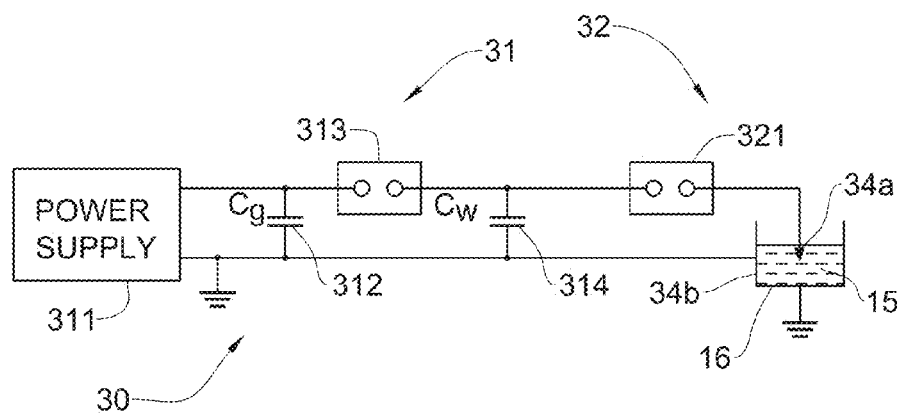
FIG. 4A is an electric scheme of a system for treatment of contaminated liquid, according to one embodiment of the present invention.

Referring to FIG. 4A, an electric scheme of an arcing electrical discharge system 30 for treatment of a contaminated fluid is shown, according to one embodiment of the invention. The system 30 includes a charge circuit 31 and a discharge circuit 32. The charge circuit 31 includes a high-voltage supply device 311 having a rectifier (not shown) providing DC voltage, and connected to a general capacitor bank 312. The charge circuit 31 also includes a pulse forming bank 314 coupled to the general capacitor bank 312 through a general switch 313. The general capacitor bank 312 and the pulse forming bank 314 can, for example, be high voltage pulse-forming networks that may comprise one or more capacitors, inductors, and/or delay lines enabling fast discharge at high currents.

According to an embodiment of the present invention, an electrical capacity $C_g$ of the general capacitor bank 312 is significantly greater than the electrical capacity $C_w$ of the pulse forming bank 314.

For example, $C_g$ can be greater than $10C_w$, and preferably can be greater than $20C_w$. This allows minimal voltage drop in general capacitor bank 312 when it partially discharges, when general switch 313 closes in order to recharge pulse forming bank 314 by charge transfer.

For example, recharging $C_w$ from full polarity reversal to full voltage when $C_g=10C_w$ by charge transfer alone will end with both having voltage $U=5/6\ U_0$, where $U_0$ is the initial voltage over $C_g$, from the equations $$Q_{final}=UC_g+UC_w=Q_{initial}=U_0C_g+(-U)C_w$$

$$U=U_0C_g/(C_g+2C_w)=10/12U_0,$$

and the voltage drop in $C_g$ is only $2C_w/(C_g+2C_w)=1/6$ of its initial, minimizing the loading of high-voltage supply device 311 by a sudden current pull from a general bank having lower voltage than the supply device. Said high-voltage supply device 311 will only need to recharge $C_g$ back to $U_0$ before next charge transfer, at relatively low current over longer time than the actual current taken to recharge $C_w$.

Depending on actual construction, the resistance, inductance, and directionality (diode-like) of the recharge may result in $C_w$ charged to lower U if charging time is insufficient, or in $C_w$ charged to $U_2>U_0$ where $U_2$ is the overshoot voltage of oscillation.

The discharge circuit 32 of the system 30 includes a working switch 321 in series with the pulse forming bank 312 and a pair of electrodes 34a and 34b in series with the working switch 321. The electrodes 34a and 34b are separated by a gap (herein also referred to as "arcing spark gap") configured for providing a sparking electric discharge therebetween within the gap in the liquid under treatment. As shown in FIG. 4A, the electrode 34a is a potential terminal that is terminated by a working end (indicated by arrow) immersed into a liquid 15, whereas the second electrode 34b is coupled to or associated with a grounded conductive body of a treatment vessel 16 holding the liquid 15. It should be understood that when desired, the potential electrode 34a can be terminated by a plurality of working ends distributed within a desired volume of the liquid 15 and connected via cables to the common electrode 34a, thereby extending the treated area.

The general switch 313 and the working switch 321 are high current switches. Preferably, such a high current switch is a three electrode spark-gap switch including two switching electrodes forming the switching paths and a third electrode (trigger electrode) configured for providing passage of high current between the two switching electrodes. Examples of the high current switches include, but are not limited to, a vacuum switch, a spark gap switch filled with a gas (trigatron), an ignitron, a thyratron, a rotary spark-gap switch, an oscillatory spark-gap switch, etc. The system 30 also includes corresponding ignition units (not shown) configured for closing the high current switches 313 and 321 by launching ignition high voltage electric pulses to the trigger electrodes. It should be noted that when desired, the high current switch 321 can be a semiconductor high current switch or a vacuum switch. The operation of spark-gap switch devices, semiconductor high current switches and vacuum switches is known per se, and therefore will not be expounded hereinbelow.

For safety reasons, one of the terminals of the high-voltage supply device 311 (for example, which is connected to the conductive body of the treatment vessel 16) is permanently grounded.

The term "vessel" is broadly used to describe any container, tank, chamber, cartridge, surrounding housing, frame assembly or any other structure that has a conductive body which can be used for holding wastewater fluid during treatment, in accordance with the teachings of the present invention. The treatment vessel 16 can be constructed of a suitable metal, plastic or composite material with thickness of the walls appropriate to withstand the strain on the walls caused by the wastewater and pressure inside the treatment vessel 16.

The liquid under treatment can, for example, be a still liquid placed in the vessel, a liquid stirred in a vessel, or a running liquid flowing through a vessel, e.g., running through a pipe. The ends of the potential electrode and the grounded electrode can be both immersed in the liquid.

To maximize the effects of hydraulic shock and the overall process effectiveness and efficiency, the treatment vessel 16 includes an internal reflector that can be shaped and configured to form an oscillating or resonating chamber that can reflect, direct and resonate hydraulic shock waves in order to achieve interference of reflected shock front waves, thus forming staggered wave pulses intersecting with their own reflections. Due to such a resonance effect, a glow-to-arc discharge can be obtained through the liquid under treatment. Various configurations of the internal reflector of the treatment vessel 16 are contemplated.

Figure 5A:
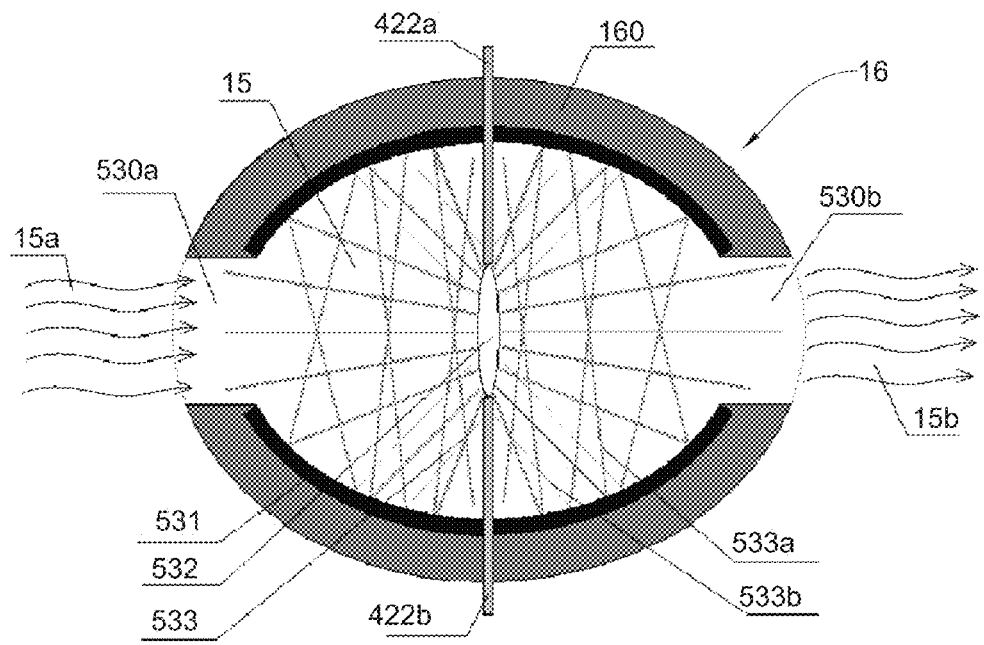
FIG. 5A is an example of a reaction vessel forming a resonation chamber for a single shock source.

Referring to FIG. 5A, a treatment vessel 16 is shown, according to one embodiment of the invention. The treatment vessel 16 has a housing 160, and is equipped with electrodes 422a and 422b positioned to form a gap for transferring a glow-to-arc pulse through the liquid 15 under treatment. It should be understood that a plurality of electrode pairs (not shown) can be provided.

The vessel 16 has an inlet port 530a for feeding the vessel 16 with untreated wastewater (indicated by arrows 15a), and an outlet 530b for releasing treated liquid (indicated by arrows 15b). The vessel 16 includes an internal reflector 531 arranged on the inner surface of the vessel 16, and adapted to reflect, direct and resonate hydraulic shock wave 533 generated by an arc flash channel 532 between the electrodes 422a and 422b. The shock front wave 533 interacts and resonate with reflected shock front waves 533a, 533b and others (not shown) to create fast compression/decompression pressure waves within liquid 15 under treatment. All the shock fronts are spaced close enough to tear apart particles and flocs suspended in the liquid 15, so microorganisms and parasites present in the liquid would be exposed. After treatment, the exposed microorganisms and parasites are killed or rendered inert by the combined effects of electrical field and hydraulic shock mentioned above.

The treatment may include exposing the microorganisms and parasites to multiple pulses from one or more electrode pairs, with initial pulse(s) serving to destroy particles or flocs into fragments and expose pathogens, and further pulses serving to completely destroy the pathogens exposed, thereby to disintegrate the floc and/or particle fragments.

Figure 5B:
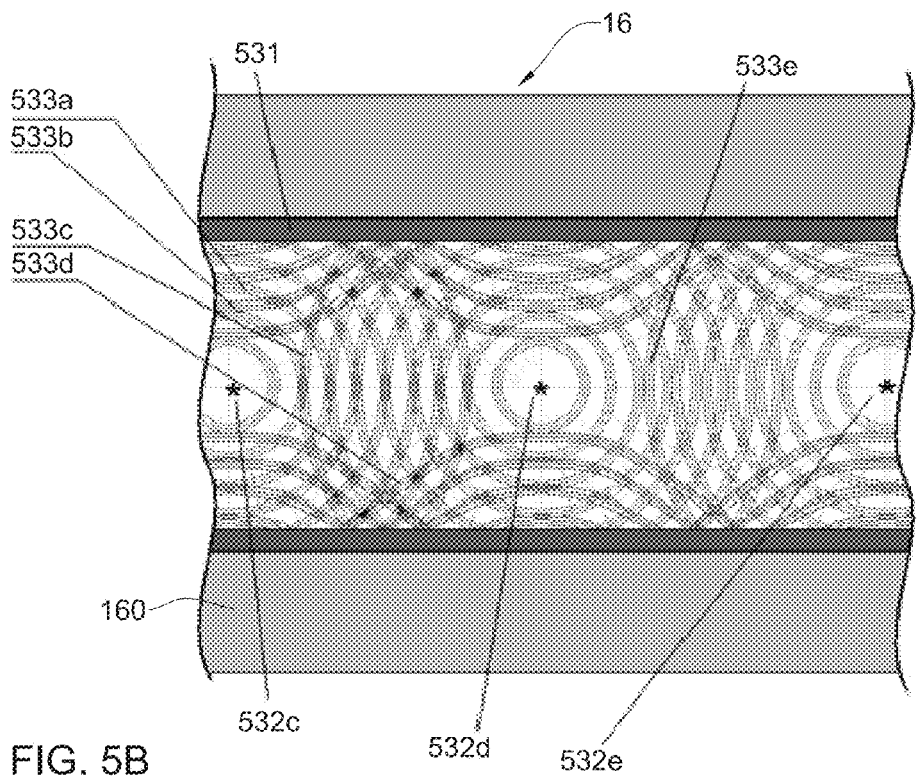
FIG. 5B is a schematic illustration of a portion of the reaction vessel utilizing a plurality of electrode pairs.

Referring to FIG. 5B, a portion of the treatment vessel 16 is shown, according to another embodiment of the invention. The treatment according to this embodiment differs from the treatment shown in FIG. 5A in the fact that the fast compression/decompression waves are achieved by the interference of shock front waves 533a to 533e originating from plurality of arc channels 532c, 532d and 532e provided by plurality of electrode pairs (not shown) operating in unison, rather than from a single reflected hydraulic shock resonating to form an interference pattern with its own reflections. The reflector 531 serves to reflect, direct and resonate hydraulic shock front waves to collide, or channels them to collide with minimum loss of pressure. This leads to higher pressures at the point where the shock fronts collide and may be more suitable for treatment of particles and pathogens having sturdier construction.

When desired, the treatment vessel 16 can include a wastewater stream deflector (not shown) configured to provide turbulence of the wastewater stream when it passes through the vessel. This provision can facilitate the physical and chemical processes occurring during electric discharge.

FIGS. 5C to 5G schematically illustrate various shapes of the reflector of the treatment vessel 16, according to various embodiments of the invention.

Figure 5C:
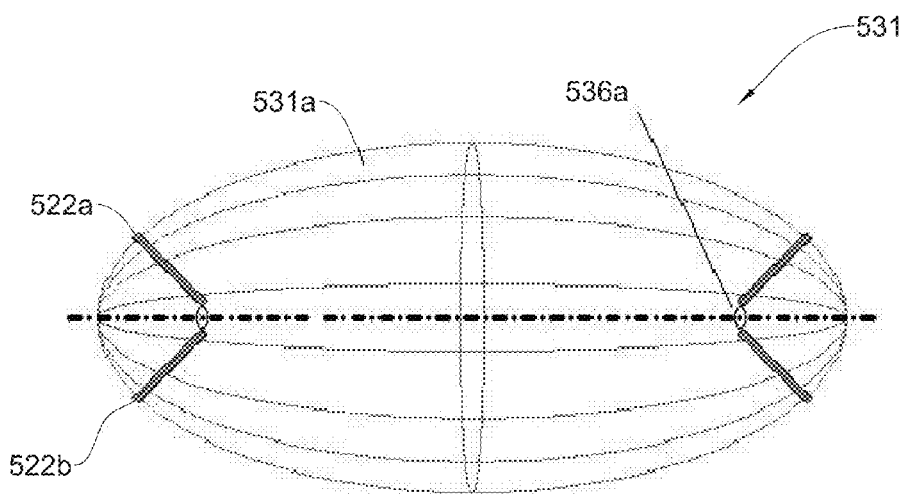
FIGS. 5C through 5I illustrate various shapes of the reflector of the treatment vessel, according to various embodiments of the invention.

As shown in FIG. 5C, the reaction vessel (16 in FIG. 5A) includes an ellipsoidal reflector 531a. The ellipsoidal reflector 531a reflects waves generated by hydraulic shock sources 536a in the form of arcing spark gap(s) defined by a space between two pairs of the electrodes 522a and 522b which are located in focal nodes of the ellipsoid reflector 531a.

Figure 5D:
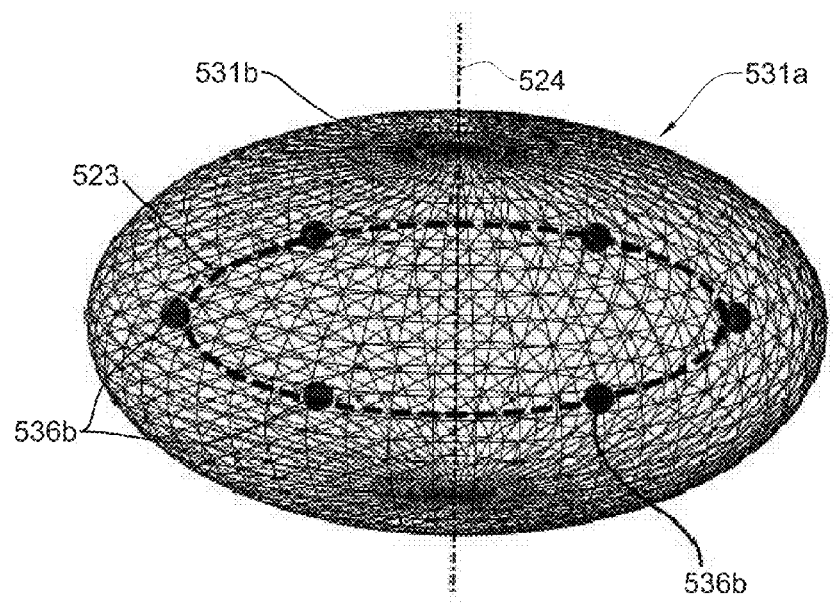

According to the embodiment shown in FIG. 5D, the treatment vessel (16 in FIG. 5A) includes a spheroidal reflector 531b. The spheroid reflector 531b reflects waves generated by two or more hydraulic shock sources 536b in the form of arcing spark gap(s) defined by a space between two pairs of the electrodes (not shown). The hydraulic shock sources 536b are located on a circle 523 passing through focal nodes around a spheroid axis 524.

Figures 5E, 5F:
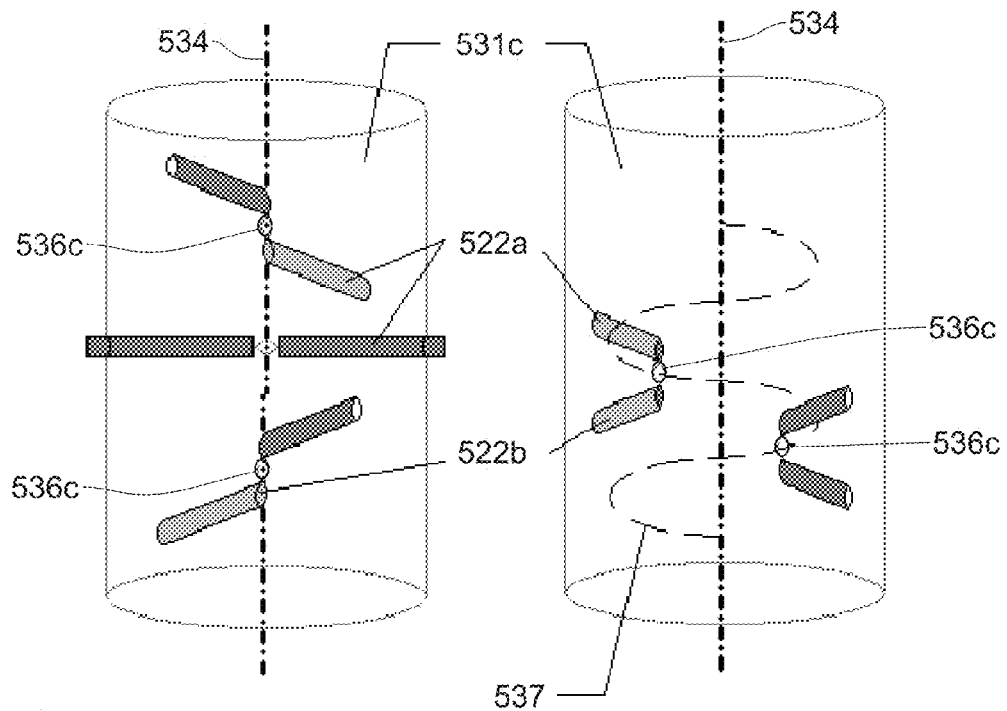

According to the embodiment shown in FIGS. 5E and 5F, the treatment vessel (16 in FIG. 5A) includes an internal reflector 531c having a cylindrical tubular shape. The tubular reflector 531c reflects waves generated by at least two hydraulic shock sources 536c in the form of arcing spark gap(s) defined by a space between the two pairs of the electrodes 522a and 522b.

According to the embodiment shown in FIG. 5E, hydraulic shock sources 536c are located along a longitudinal tube axis 534. According to the embodiment shown in FIG. 5F, hydraulic shock sources 536c are located along a helix 537 turning around the axis 534.

Figure 5G:
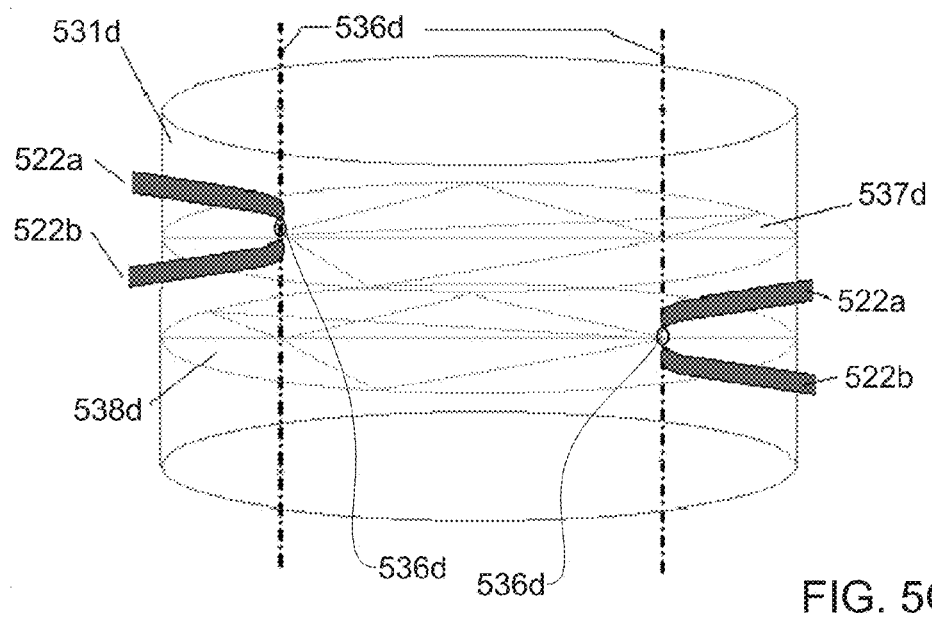

According to the embodiment shown in FIG. 5G, the treatment vessel (16 in FIG. 5A) includes an elliptic tubular reflector 531d. The elliptic tubular reflector 531d reflects waves generated by at least two hydraulic shock sources 536d in the form of arcing spark gap(s) defined by a space between two pairs of the electrodes (not shown). For example, the hydraulic shock sources 536d (arcing spark gaps) can be arranged at focal nodes on the same plane 537d. Alternatively, (as shown in FIG. 5G) the hydraulic shock sources 536d can be located at a focal node on another plane 538d that is parallel to the plane 537d, i.e., the hydraulic shock sources 536d are staggered.

Figure 5H:
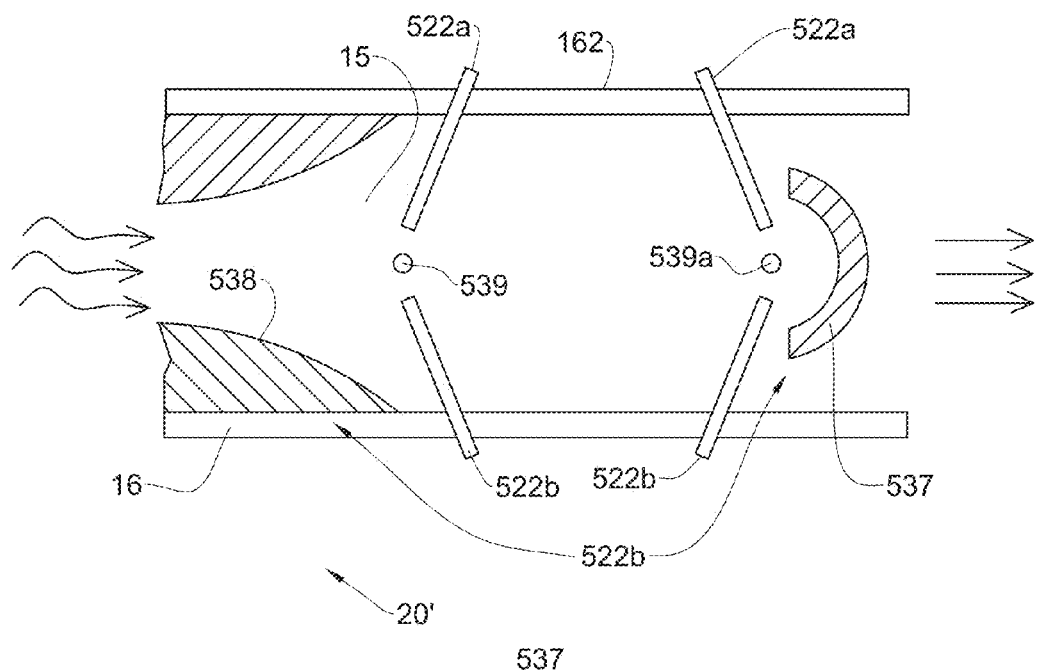

According to the embodiment shown in FIG. 5H, the treatment vessel (16 in FIG. 5A) has a tubular shape, and includes one or more internal optical devices 539 arranged in the vessel 16. The optical devices 539 include a concave reflector 537 arranged within a volume of the treatment vessel and a convex reflector 538 mounted on the tubular wall of the treatment vessel 16. The optical device(s) 539 is (are) configured to direct, to split, and to focus said hydraulic shock waves passing through the wastewater 15 under treatment. For this purpose, a principal axis 540 of the concave reflector 537 is directed substantially along the longitudinal axis (not shown) of the tubular body of the treatment vessel 16. The concave reflector 537 reflects waves generated by a first hydraulic shock source 539a being in the form of an arcing spark gap defined by a space between two pairs of the electrodes 522a and 522b. The hydraulic shock source 539a is preferably arranged at the focus of the concave reflector 537. The convex reflector 538 reflects waves generated by a second hydraulic shock source 539b being in the form of an arcing spark gap defined by a space between two pairs of the electrodes (not shown).

Figure 5I:
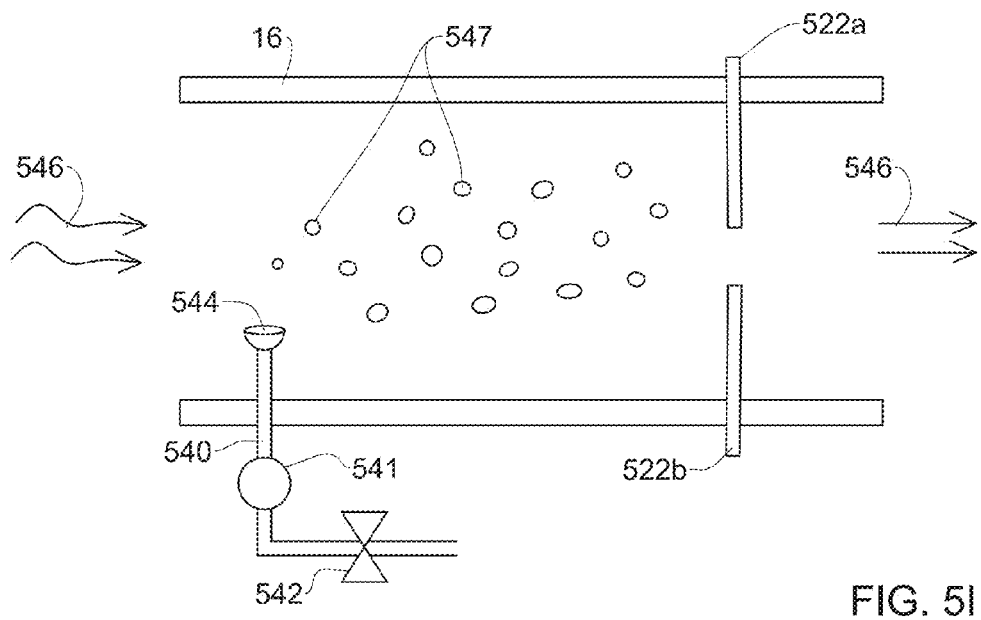

FIG. 5I illustrates a portion of the treatment vessel (16 in FIG. 5A), according to a further embodiment of the invention. The treatment vessel 16 is equipped with electrodes 522a and 522b positioned to form a gap for transferring a glow-to-arc pulse through the wastewater 15 under treatment. It should be understood that when desired, a plurality of electrode pairs (not shown) can be provided. The treatment vessel 16 includes an inlet gas manifold 540, and a blower fan 541 for providing a flow of air collected from the atmosphere or a gas mixture containing oxygen to pass through the manifold 540. A controllable valve 542 is located in the manifold 540 for controlling the velocity of the gas flowing therethrough. At the end 543 of the manifold 540, a nozzle 544 is provided for allowing a gas stream (indicated by arrows 545) to be mixed with the liquid stream (indicated by arrows 546) to form a plurality of bubbles 547. The gas bubbles 547 are delivered to the gap 548 between the electrodes 522a and 522b by the liquid stream. Oxygen contained in the gas can significantly enhance the oxidation processes occurring during electric discharge.

The operation of the system 30 begins by charging the general capacitor bank 312 by the voltage supply device 311. The general switch 313 and the working switch 321 are both in the switched off position. In operation, the general capacitor bank 312 is permanently charged since it is permanently connected to the voltage supply device 311.

The general capacitor bank 312 can be partially discharged by closing (switching on) the general switch 313, to supply a high voltage to the pulse forming bank 314. The decrease of voltage across the general capacitor bank 312 owing to this discharge can be estimated by up to $2C_w/(C_g+2C_w)$ for charge transfer alone, and in practice it is even lower. Due to the condition $C_g>>C_w$, this loss is relatively small, i.e., $2C_w/(C_g+2C_w)<<1$. Thus, the drop of the voltage across the general capacitor bank 312 can be easily compensated by charging the general capacitor bank from the voltage supply device 311. As soon as the charging process of the pulse forming bank 314 is complete, the general switch 313 should be switched off in order to break the connection between the general capacitor bank 312 and the electrode 34a through pulse forming bank 314, and thereby to avoid a further discharge of the general capacitor bank 312 together with the pulse forming bank 314.

Closing the working switch 321 results in discharge of the pulse forming bank 314 and generation of a transient electric current pulse through the sludge or other fluid under treatment in a spark gap between the electrodes 34a and 34b.

The transient electric current pulse provides a glow-to-arc discharge through the fluid.

FIG. 3B shows a typical wave-form of a glow-to-arc pulse discharge, according to an embodiment of the present invention. A voltage function created by the glow-to-arc action of the pulse discharge over the gap across the electrodes starts with a high voltage having trapezoidal shape. The trapezoidal voltage is characterized by a fast rise (i) and a voltage spike overshoot (ii) and then by a sloped top DC plateau. The plateau includes an ionization region (iii), and an electron depletion region (iv). The plateau is followed by a sharp voltage drop (v) due to dielectric breakdown. Further, the voltage function is characterized by an oscillating decay (vi) ending with a cut-off (vii). Thus, since the value of the electrical resistance R of the fluid media changes through the stages of the dielectric breaking down, the current starting with DC behavior changes with a RC decay, and is then followed by an RLC oscillation behavior.

It should be noted that the stages (i) to (iv) provide the E-field driven phenomena in the fluid, and must have sufficient electric field strength and duration for molecular activation, molecular stretching and/or disentanglement of the cellular and floc-type organic structures, and electroporation. While stage (v) must provide sufficient power to the arc-driven phenomena listed above, stage (iv) may be omitted in practice, or used to promote more radical formation, better cavitation or better shock interaction.

A high strength electric field and electro-hydraulic shock wave are formed within the fluid under treatment, accompanied by intensive light radiation, electro-chemical and thermo-chemical reactions within the treated fluid.

When the parameters of the discharge circuit 32 are such that the transient current and voltage includes oscillation, a reverse voltage $U_w^{(-)}$ corresponding to the negative reverse components of the oscillating transient voltage can occur across pulse forming bank 314. This reverse polarity voltage is always less than the original charging voltage U. The corresponding negative electric charge $Q_w^{(-)}=C_w U_w^{(-)}$ associated with the oscillating transient voltage has a magnitude that is significantly less than the positive electric charge $Q_g^{(+)}=C_g U_0^{(+)}$ stored in the general capacitor bank 312. Therefore, the total electric charge across the general capacitor bank 312 will have a positive magnitude, thereby preventing passage of a damaging negative reverse component of the oscillating transient voltage through the voltage supply device 311.

For example, the energy required for disinfection of a certain volume of liquid is in the range of up to 100 J (Joules). For this case, for example, a working capacitance $C_w$ of the pulse forming bank 314 can be 0.1 µF (microfarad), the general capacitance $C_g$ can be 10 µF, and a working voltage can be 30 kV. Accordingly, in the pulse forming bank 314, the energy stored is $W=C_wU^2/2=45$ J, and the electric charge is $Q_w=C_wU=3\cdot10^{-3}$ Q (Coulombs); whereas, in the general capacitor bank 312, the energy stored is 450 J, and the electric charge is 0.3 Q. As can be understood, in this case, variation of the voltage is due to the reverse component of the oscillating transient voltage that can be estimated as $Q_w/C_g=300V$. Accordingly, the voltage variation does not exceed 1%.

Figure 4B:
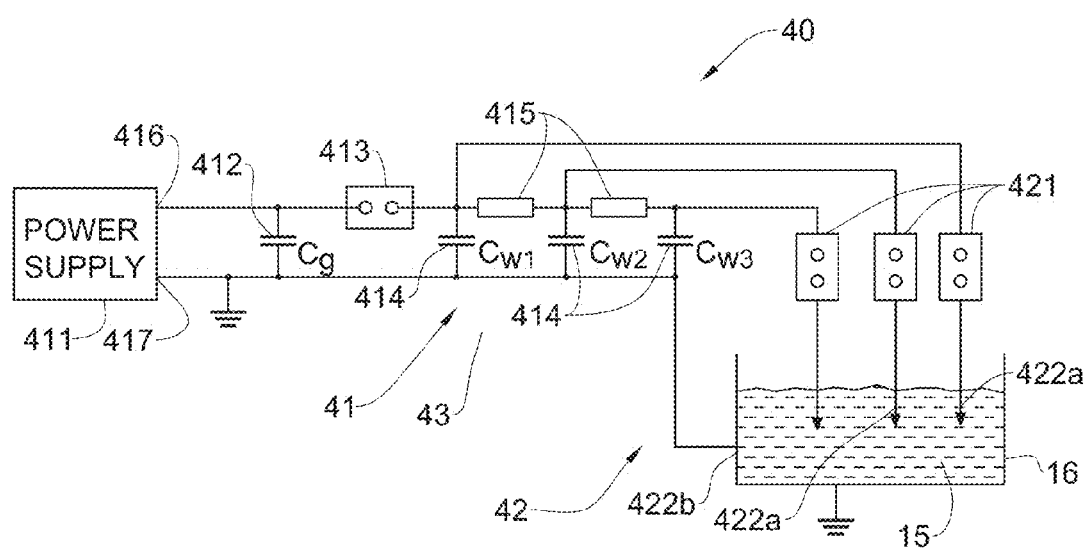
FIG. 4B is an electric scheme of an alternative embodiment of the system of the present invention.

Referring to FIG. 4B, an electric scheme of a system 40 for treatment of a contaminated liquid is shown, according to another embodiment of the invention. The system 40 includes a charge circuit 41 and a plurality of equivalent discharge modules 42 electrically coupled to charge circuit 41. For the purpose of simplicity of illustration, only three discharge modules 42 are shown in FIG. 4B, however, any desired number of discharge modules 42 can be used.

The charge circuit 41 includes a high-voltage supply device 411 connected to a general capacitor bank 412 and a plurality of pulse forming banks 414 coupled to the general capacitor bank 412 through a general switch 413. The pulse forming banks 414 are separated from each other by current resistive elements 415.

As shown in FIG. 4B, the current resistive elements 415 are all arranged in the potential electric line that is coupled to a potential terminal of the high-voltage supply device 411 in series through the general switch 413. However, when desired, corresponding current resistive elements can be arranged in parallel or in series between the pulse forming banks 414 in the potential and/or the grounded line. In these cases (not illustrated in FIG. 4B), the resistive elements can be coupled to a grounded terminal 417 of the high-voltage supply device 411. The purpose of the current resistive elements 415 is to separate the discharge modules 42 from each other as will be described hereinbelow.

Each discharge module 42 comprises a working switch 421 in series with the corresponding pulse forming bank 414 and a corresponding potential electrode 422a arranged in series with the working switch 421. The potential electrode 422a is separated by a gap with a ground electrode 422b. In operation, the electrodes 422a and 422b should be immersed into a liquid 15 and distributed over a desired volume under treatment for providing an electric discharge within their respective independent gaps. As shown in FIG. 4B, only the electrodes 422a of all the discharge modules 42 are terminated by working ends (indicated by arrows) immersed and distributed into the liquid 15 under treatment, whereas the second electrodes 422b of all the discharge modules 42 are all connected together and coupled to or associated with the grounded conductive body of the treatment vessel 16 holding the liquid 15.

For safety reasons, one of the terminals of the high-voltage supply device 411 (preferably, connected to the treatment vessel 16) is permanently grounded. According to an embodiment of the present invention, all the ground terminals of the general capacitor bank 412 and the pulse forming banks 414 can be connected together by a common grounded bus 43 coupled to the grounded terminal of the high-voltage supply device 411. Preferably, the grounded bus 43 is implemented on the basis of a conductive bus-bar or a minimum-inductance bus or cables. Examples of materials suitable for the common conductive bus-bar include, but are not limited to, copper and aluminum. Examples of common construction suitable for minimal inductance include bifilar, coaxial, high width-to-separation distance bi-planar to tri-planar collector, etc.

The operation of the system 40 is similar to the operation of the system 30, mutatis mutandis, and it begins by charging the general capacitor bank 412 by the voltage supply device 411 with the general switch 413 and the working switches 421 all in their switched off state. In operation, the general capacitor bank 412 is permanently charged since it is permanently connected to the voltage supply device 411. The general capacitor bank 412 can be partially discharged by switching on the general switch 413, to supply a high voltage to the pulse forming banks 414 while keeping working switches 421 in their switched off state. As soon as the charging process of pulse forming banks 414 is complete, the general switch 413 should be switched off in order to break the connection between the general capacitor bank 412 and the outputs to electrodes 422a through pulse forming banks 414, and thereby to avoid a further discharge of the general capacitor bank 412 together with the pulse forming bank 414. Closing one or more working switches 421 results in discharge of the corresponding pulse forming banks 414 and generation of a transient voltage and electric current pulse between the electrodes 422a and 422b through the liquid 15 under treatment.

According to an embodiment, the general switch 413 and the working switches 421 are three electrode spark-gap switches including two switching electrodes forming the switching paths and a mechanical moving contact providing the making and breaking of the high current between the two switching electrodes.

According to an embodiment, the general switch 413 and the working switches 421 can, for example, be vacuum switches (ignitrons) which are activated by a common ignition circuit (not shown), so as to provide substantially simultaneous ignition thereof. However, it was found that, in practice, the working switches 421 cannot operate simultaneously. Thus, even a slight ignition advance of one of the switches can lead to a voltage drop on the pulse forming bank 413, such that ignition of the rest of the switches will be prevented.

In order to exclude such a possibility, the present embodiment teaches to couple each of the pulse forming banks 414 to another pulse forming bank 414 through the current resistive elements 415. Consider a case when one of the working switches 421 comes into action ahead of the other switches. The variations of the voltage U over time t across the pulse forming banks 414 in the discharge modules 42 in which the switches were not yet activated can be estimated by $$U=U_{max}\exp(-t/RC),$$

where $U_{max}$ is the maximal voltage, R is the electrical resistance of the resistive elements 415 and C is the capacitance of each pulse forming bank 414.

According to an embodiment of the present invention, the magnitude of the electrical resistance R is such that the ignition delay τ between the working switches 421 would be less than, or equal to, the relaxation time constant RC of the pulse forming bank 414, to wit: τ≤RC. For example, in practice, the ignition delay can be in the range of several microseconds. Such a provision can prevent a too sharp voltage decrease across the pulse forming banks 414, and thus enable the concurrent operation of all the working switches 421. An additional functionality of this separation is to direct all the discharge currents of each capacitor bank through its respective switch, thus to prevent switch overloading.

For example, typical values for the components of the system 40 and the parameters of its operation are as follows.

The number of the discharge modules 42 can, for example, be in the range of 3 to 15, the nominal voltage provided by the high-voltage supply device is 30 kV, the electrical resistance of the resistive elements 415 is in the range of 1 kOhm to 10 kOhm, the capacitance $C_g$ of the general capacitor bank 412 is in the range of 4 microfarads to 12 microfarads, and the capacitance $C_w$ of the pulse forming bank 414 is in the range of 0.1 microfarads to 0.5 microfarads.

According to another embodiment, each high current switch 421 can be activated by a plurality of dedicated ignition circuits (not shown), so as to provide a desired sequence of activation of the current switches 421, in accordance with a predetermined algorithm.

When desired, all the pulse forming banks 414 can have the same value of electric capacitance. Alternatively, the electric capacitance values $C_{w(i)}$ of individual pulse forming banks 414 may be different (i=1, 2, . . . N; where N is the number of the pulse forming banks 414).

Figure 6:
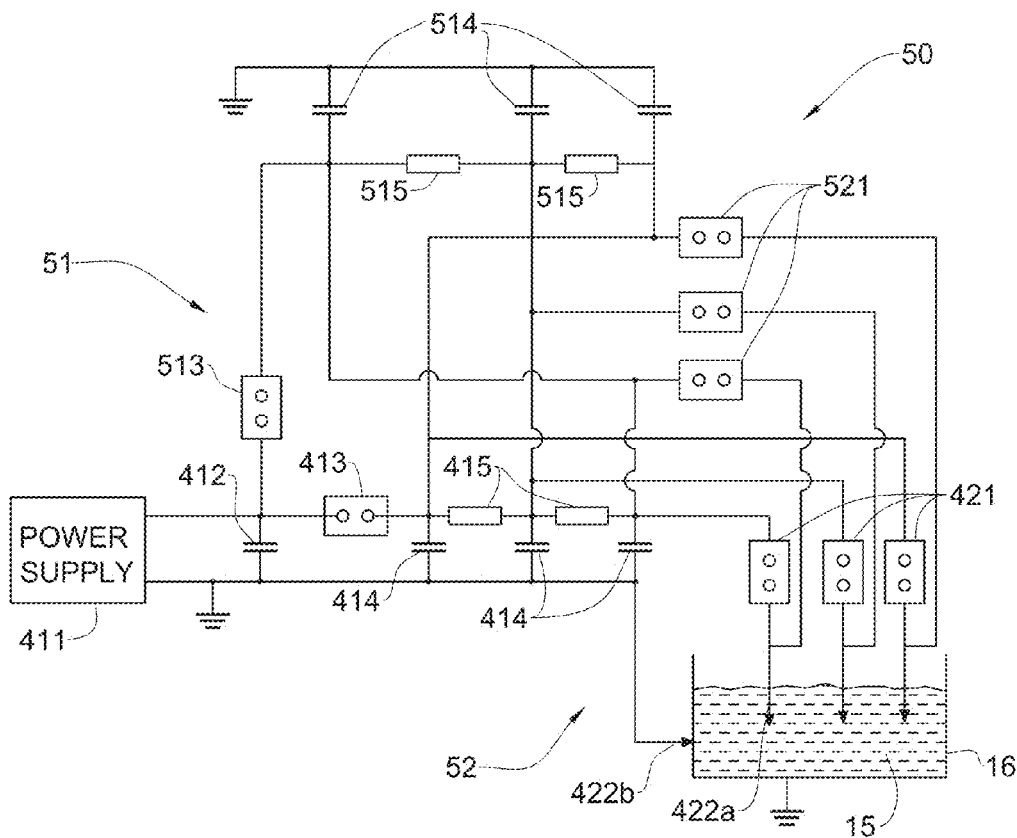
FIG. 6 is an electric scheme of a system for producing a strong electric pulse, according to a further embodiment of the present invention.

Referring to FIG. 6, an electric scheme of a system 50 for treatment of a contaminated liquid is shown, according to a further embodiment of the invention. The system 50 includes a charge circuit 51 and a plurality of equivalent discharge modules 52 electrically coupled to charge circuit 51. The system 50 differs from the system (40 in FIG. 4B) in the fact that it further includes a plurality of additional pulse forming banks 514 coupled at one terminal to the general capacitor bank 412 through an additional general switch 513. The additional pulse forming banks 514 are separated from each other by additional current resistive elements 515 arranged in the potential power line. The other terminal of the additional pulse forming banks 514 is grounded.

The system 50 also comprises an additional working switch 521 in series with the potential terminal of the corresponding additional pulse forming bank 514 that is coupled to the corresponding electrode 422a immersed into the liquid 15.

According to an embodiment of the invention, an additional electrical capacity $C_{add}$ of the additional capacitor bank 514 is greater than an electrical capacitance $C_w$ of the pulse forming bank 414, but is less than an electrical capacitance $C_g$ of the general capacitor bank 412, i.e., $C_w < C_{add} << C_g$. For example, the capacitance $C_g$ of the general capacitor bank can be in the range of 10 μF to 50 μF (microfarad), the capacitance $C_w$ of the pulse forming bank 414 can be in the range of 0.01 μF to 0.5 μF, and the capacitance $C_{add}$ of the additional pulse forming bank 514 can be in the range of 1 μF to 5 μF.

It should be noted that the system 50 is, in practical terms, most useful in cases where the electrodes 422a of all the discharge modules 42 are sparsely distributed within the liquid 15 under treatment.

Operation of the system 50 begins by charging the general capacitor bank 412 by the voltage supply device 411. The general switch 413, the working switches 321, and the additional working switches 521 can all be maintained in the switched off state. In operation, the general capacitor bank 412 is permanently charged since it is permanently connected to the voltage supply device 411. The general capacitor bank 412 can be partially discharged by closing (switching on) the general switch 413 to supply a high voltage to the pulse forming banks 414, and by closing (switching on) the additional general switch 513 to supply a high voltage to the additional pulse forming banks 514. The decrease of voltage across the general capacitor bank 412 owing to this discharge is relatively small, due to the condition $C_g >> C_{add} + C_w$. Thus, the drop of the voltage across the general capacitor bank 412 can be easily compensated by charging the general capacitor bank from the voltage supply device 411. As soon as the charging process of the pulse forming banks 414 is complete, the general switch 413 should be switched off in order to disconnect the general capacitor bank 412 from the pulse forming banks 414, and thereby to avoid a further discharge of the general capacitor bank 412 together with the pulse forming banks 414.

Closing one or more working switches 421 (but maintaining all the additional working switches 521 in the switched off state) results in the electric discharge of the corresponding pulse forming banks 414 and generation of a transient voltage and a transient electric current pulse between the potential electrodes 422a and the grounded electrode 422b that is associated with the body of the vessel 16 through the liquid 15 under treatment. This preliminary pulse is responsible for stages (i) through (iv) in FIG. 3B. Once the ionization and electron depletion is over without losing the charge in the additional capacitor bank 514, one or more additional working switches 521 are then closed (switched on) in order to maintain or enhance the electric current discharge within the liquid, thereby resulting in the electric discharge of the corresponding additional pulse forming banks 514 and improved transient electric current and voltage between the corresponding potential electrodes 422a and the grounded electrode 422b.

It should be noted that when a certain type of working switch is used, e.g., thyratrons, then one of the switch electrodes has to be permanently grounded.

Figure 7:
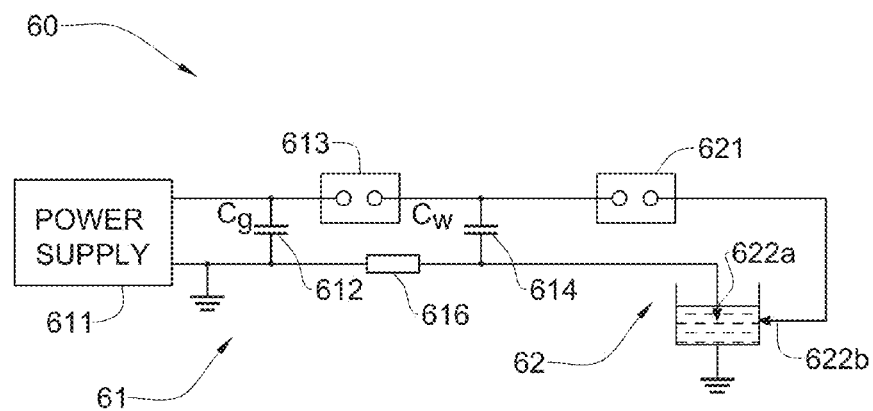
FIG. 7 is an electric scheme of a system for producing a strong electric pulse, according to yet a further embodiment of the present invention.

Referring to FIG. 7, an electric scheme of a system 60 for treatment of a contaminated liquid is shown, according to a further embodiment of the invention. The system 60 includes a charge circuit 61 and a discharge module 62 electrically coupled to the charge circuit 61. The charge circuit 61 includes a high-voltage supply device 611 connected to a general capacitor bank 612 and a pulse forming bank 614 coupled to the general capacitor bank 612 at one terminal through a general switch 613 and at another terminal through a general resistive element 616 that connects the ground terminals of the general capacitor bank 612 and the pulse forming bank 614.

The discharge module 62 of the system 60 includes a working switch 621 that is arranged in series with the pulse forming bank 613 and electrodes 622b and 622a separated by a gap in series with the working switch 621 for providing an electric discharge within the gap.

As shown in FIG. 7, the electrode 622a is connected to the general resistive element 616 designed for protecting the high-voltage supply device 611 from overload. In this case, the potential electrode of the high-voltage supply device 611 is disconnected from its grounded electrode, and charging of the pulse forming bank 614 is provided through general resistive element 616. The charging current and the current drawn during reversed polarity of the pulse forming bank 614 can also be limited.

The electrode 622a is terminated by a plurality of working ends immersed into the liquid 15 and distributed within a desired volume of the liquid, although merely one working end can also be utilized. The working ends are connected via cables to the common potential electrode 622a. The second electrode 622b is coupled to or associated with a grounded conductive body of the treatment vessel 16 holding the liquid 15.

For safety reasons, one of the terminals of the high-voltage supply device 611 (e.g., the "negative" terminal) is permanently grounded. Moreover, the conductive body of the treatment vessel 16 is also permanently grounded.

Operation of the system 60 begins by charging the general capacitor bank 612 by the voltage supply device 611. In operation, the general capacitor bank 612 is permanently charged since it is permanently connected to the voltage supply device 611. The general capacitor bank 612 can be partially discharged by closing (switching on) the general switch 613, to supply a high voltage to the pulse forming bank 614. The loss of voltage across the general capacitor bank 612 owing to this discharge can be estimated by $C_w/(C_g+C_w)$ on average and $2C_w/(C_g+2C_w)$ in the worst case. Due to the condition $C_g \gg C_w$, this loss is relatively small, i.e., $2C_w/(C_g+2C_w) \ll 1$. Thus, the drop of the voltage across the general capacitor bank 612 can be easily compensated by charging the general capacitor bank from the voltage supply device 611.

The pulse forming bank 614 can be discharged by opening (switching off) the general switch 613 and then closing (switching on) the working switch 621 to discharge the pulse forming bank 614, thereby generating a transient voltage and electric current pulse between the electrodes 622b and 622a through the fluid under treatment.

Each of the described above embodiments of the system and method of the present invention for treatment of wastewater sludge and contaminated liquid can be utilized at various treatment stages of a multistage treatment process at a wastewater treatment plant.

For example, in order to generate an arcing electric current discharge within the waste-activated sludge, a pulsed electrical field with a strength in the range of 10 kV/cm to 200 kV/cm can be used. A peak pulsed current can, for example, be in the range of 15 kA to 50 kA. A pulse width can, for example, be in the range of 3 microseconds to 10 microseconds, and a pulse repetition rate (pulse frequency) can, for example be in the range of 10 pps to 500 pps (pulses per second), It should be noted that these values depend on the flow rate and solid quantity of the sludge, to ensure that a specified energy/dry ton of solid is transmitted to the treated matter.

Figure 8:
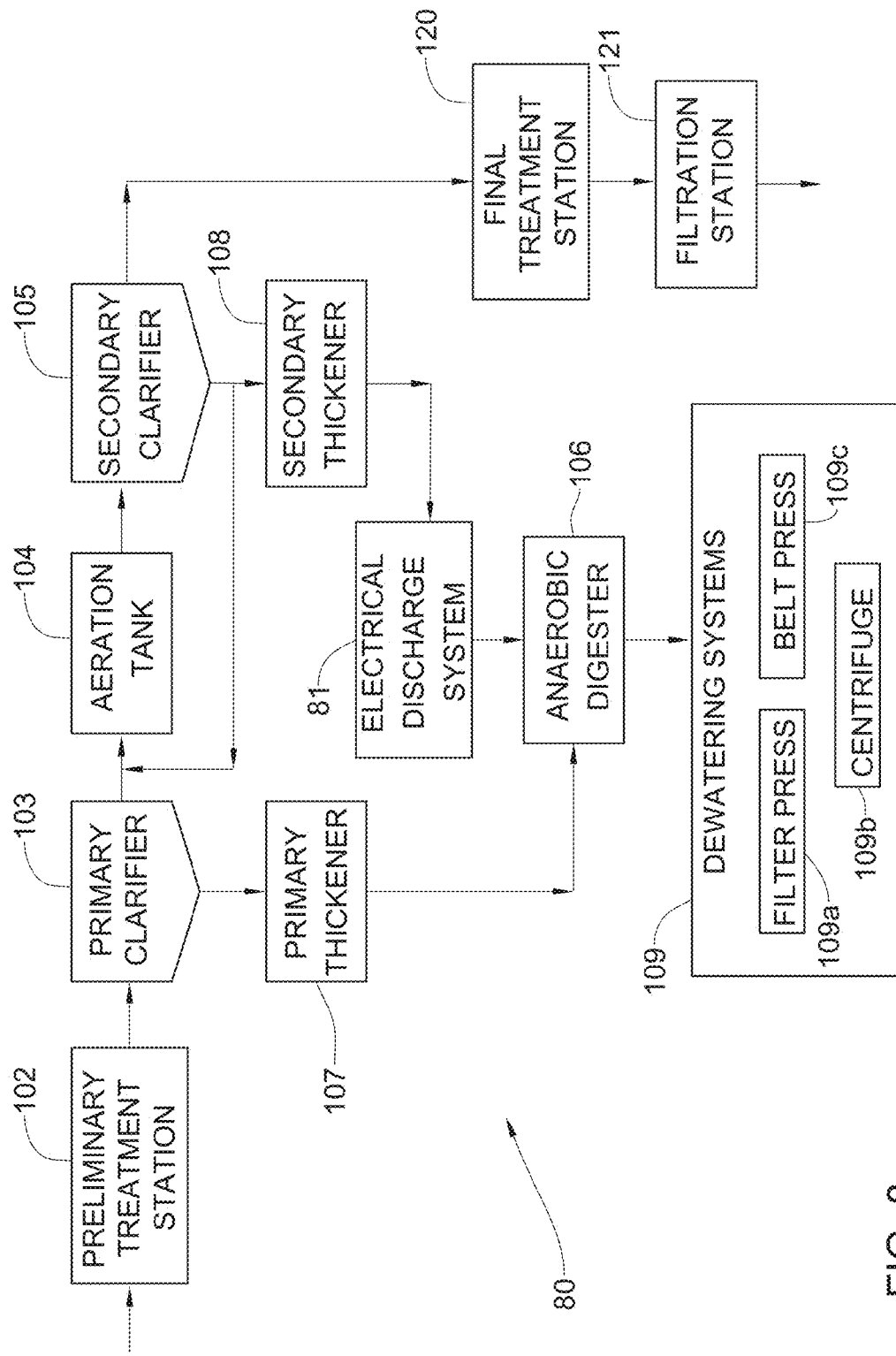
FIGS. 8, 9, 10A-10D and 11 illustrate schematic views of treating wastewater sludge in wastewater treatment plants, according to different embodiments of the present invention.

Referring to FIG. 8, a schematic view of treating of municipal wastewater sludge in a WWTP (wastewater treatment plant) 80 is illustrated, according to one embodiment of the present invention. The WWTP 80 differs from the prior art WWTP (100 in FIG. 1) in the fact that the WWTP 80 is configured for treating the waste activated sludge (WAS) that leaves the secondary clarifier 105 by subjecting it to treatment using an electrical discharge system (indicated by a reference numeral 81) of the present invention.

As shown in FIG. 8, the electrical discharge system 81 is arranged downstream of the secondary thickener 108 and upstream of the anaerobic digester 106. However, when the secondary thickener is optional, and is not included in the WWTP, the electrical discharge system 81 can be arranged directly downstream of the secondary clarifier 105.

In operation, a portion of the WAS leaving the secondary clarifier 105 can be returned to the aeration tank 104 as return activated sludge (RAS) to help perpetuate the aerobic biodegradation process, while any excess sludge portion is delivered to the electrical discharge system 81. When desired, the waste activated sludge (WAS) leaving the secondary clarifier 105 may be optionally thickened at the secondary thickener 108 to increase the solids concentration, and only after thickening be provided to the electrical discharge system 81.

In operation, the electrical discharge system 81 generates a transient glow-to-arc electric pulse with the appropriated voltage and current wave-form through the sludge in a spark gap between the electrodes. A fast-changing and strong electric field of required duration and an electro-hydraulic shock wave of required power and intensity are formed within the sludge under treatment, which are accompanied by light radiation, and electro-chemical and physical phenomena described above.

As a result of the discharge of the arcing electric current, the cellular and floc-type organic structures in waste-activated sludge can be broken up and destroyed, thereby releasing intra-cellular and intercellular fluid that is rich in nutrients. The remaining organic solids can be partly hydrolyzed, which can enhance their further digestion. After releasing the intra-cellular and intercellular water, the organic solid-contents suspended in solution is reduced in volume and mass, which can simplify sludge post-treatment processes. Thus, after treatment of the WAS by the electrical discharge system 81, the resulting organic solid-contents become readily available as food for digestion when the treated WAS is fed to the anaerobic digester 106.

As shown in FIG. 8, the treated waste activated sludge leaving the electrical discharge system 81 and the raw sludge (primary sludge) leaving the primary clarifier 103 are delivered to the anaerobic digester 106, where they are exposed to microorganisms for anaerobic digestion that further degrade the sludge biologically. The destruction of the structures of the microorganism cell and the flocs of the microorganism cells enrich the WAS with organic material. This material is used as food for the microorganisms participating in the biological digestion in the anaerobic digester 106. As a result, the amount of methane in the yield by-product gases can be increased, while the amount of carbon dioxide and hydrogen sulfide can be decreased.

The viability and effectiveness of the electrical discharge for disrupting the biomass in waste activated sludge (WAS) derived from municipal wastewater treatment has been proven in laboratory testing and on-site pilot projects. Pilot plants for testing have been developed and deployed at wastewater treatment plants that generate WAS. A Pulsed Electric Discharge (PED) system that could handle up to 2.5 cubic meters per hour of WAS feed was designed and built. Such a waste water treatment plant can be appropriate for small WWTP processing about 8,500 cubic meters/day of municipal sewage. The treatment required a total of 16 kW (20 kVA power supply).

The electrical discharge system 81 having four pairs of electrodes was configured and capable to generate 30 kV and handle a peak pulsed current of 15 kA of 3 microsecond pulse width, and of 10 pps to 50 pps pulse rate. The WAS solid content was in the range of 2% to 5% of the total solids.

The treatment results show destruction of the microorganism cell structures and the flocs of the microorganism cells that enrich the WAS with organic material used as food in the anaerobic digester 106. Thus, the digesting time was 20% shorter and 40% more effective in total solid weight removed, when compared to the prior art plant (100 in FIG. 1) that does not include an electrical discharge system. Likewise, the conducted test showed that in a wastewater treatment plant employing the electrical discharge system of the present invention, methane production can be increased by 20% to 60%, and the amount of "dry" solid to be removed can be reduced by 40 weight %.

In addition, it was found that when the treating energy applied to the WAS was greater than 800 kilowatt-hours per dry ton, the pathogen count in the treated sludge was drastically reduced, transforming the sludge to the safe Class "A" bio-solids waste material (under EPA 503 regulations)

without the need to boil or compost. A sludge of Class "A" can be safe for use as fertilizer, making for additional income above, and furthermore saving the expellant trucking cost and the several weeks required for the composting stage utilized in a prior art WWTP.

It should be noted that there is a significant difference in the operation and efficacy of the electrical discharge system 81 that employs glow-to-arc electric discharge over the electroporation apparatus described in the prior art references U.S. Pat. Nos. 6,491,820; 6,540,919; 6,709,594 and 7,001,520. As described above, these references describe systems and methods for treatment of biologically-active waste-water sludge by a pulsed electric-field system which applies non-arcing high electrical field to sludge.

Contrary to the electrical discharge system of the present application, the electric field generated by the electroporation apparatus of the prior art does not provide arcing discharge within the treated waste material. In operation, the time-varying electric field causes acceleration of ions and other charged micro-particles, which collide with the cells and flocs in the sludge causing micro-currents across microbial cells, and electrostatic pull over molecules of the cell membranes, thereby disrupting their water retention capability and providing destruction of their structures.

Moreover, when characteristics of the pulse width of the used electric field are close to the relaxation time of the "bound" water molecules and/or to the relaxation time of other polar organic molecules, the applied pulsed electric field can produce heat mainly because the excitation caused by the time-varying electric field that causes the polar molecules having electric dipole moment to rotate back and forth as a result of the torque placed upon them by the time-varying electric field. When the parameters of the time-varying electric field do not suit the dielectric characteristics (e.g., relaxation time) of the sludge molecules, heat will not be generated. Accordingly, the prior art electroporation apparatus has much lower efficiency than that of the electrical discharge system of the present application.

It should be noted that although electric parameters of the time-varying electric parameters used in the prior art references U.S. Pat. Nos. 6,491,820, 6,540,919, 6,709,594 and 7,001,520 are such that they can produce arcing electric discharge between the electrodes, the systems described in these prior art references refrain from using an arcing electric field in favor of non-arcing voltage and pulse width, possibly due to the problems associated with the prior art techniques described in the background section above with references to FIGS. 2 and 3.

Figure 9:
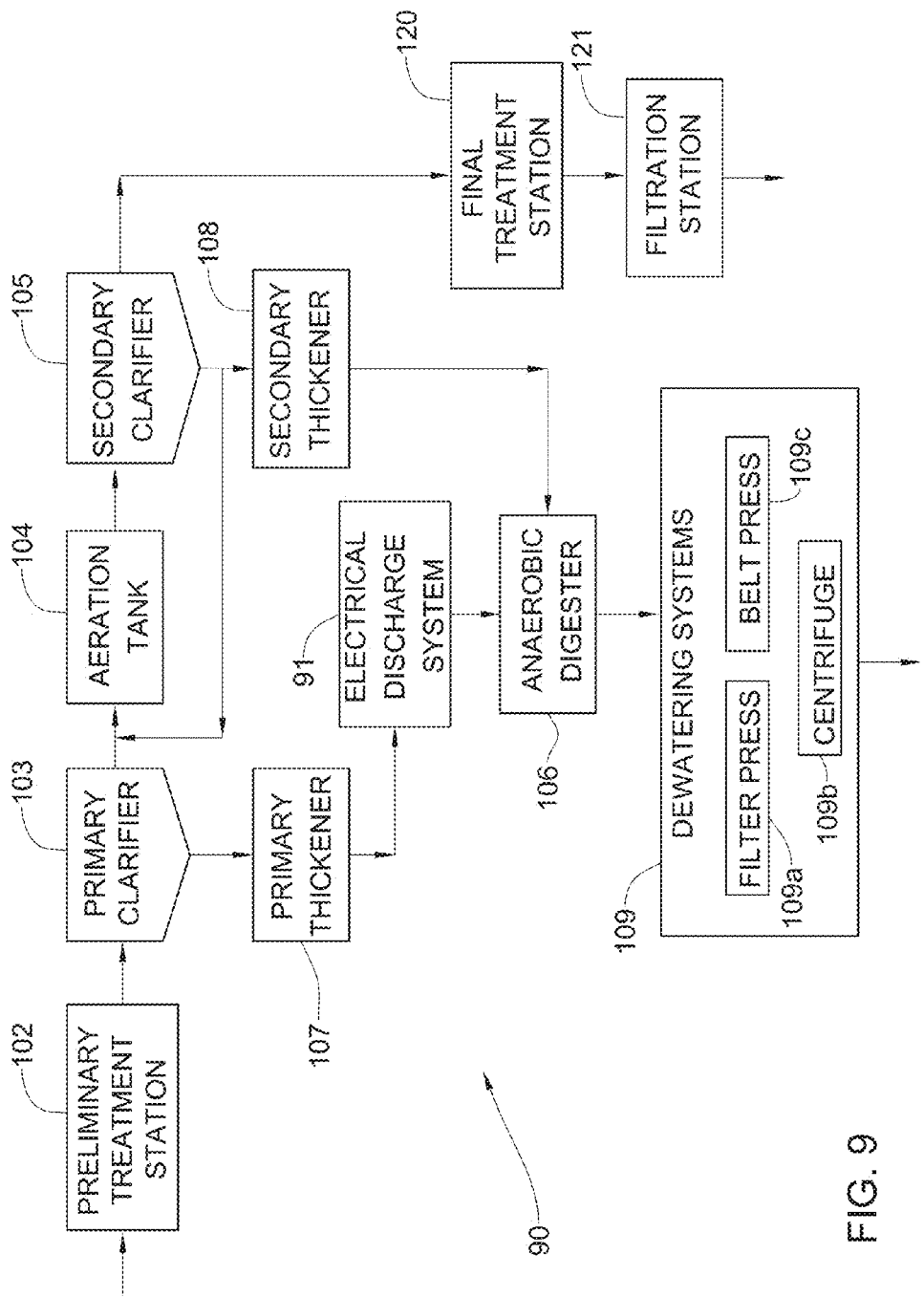

Referring to FIG. 9, a schematic view of treating of municipal wastewater sludge in a WWTP 90 is illustrated, according to another embodiment of the present invention. The WWTP 90 differs from the prior art wastewater treatment plant (100 in FIG. 1) in the fact that the plant 90 is configured for treating the primary sludge leaving the primary clarifier 103 by using an electrical discharge system (indicated by a reference numeral 91) of the present invention. The system 90 can be useful to decompose relatively large solids and organic meters in the primary sludge in order to assist in creating easier digestion of the waste at the later stages.

As shown in FIG. 9, the electrical discharge system 91 is arranged downstream of the primary thickener 107 and upstream of the anaerobic digester 106. However, when the primary thickener 107 is optional, and is not included in the wastewater treatment plant, the electrical discharge system 91 can be arranged directly downstream of the primary clarifier 103.

In operation, as shown in FIG. 9, the primary sludge leaving the primary clarifier 103 is thickened at the primary thickener 107 to increase the solids concentration, and, after thickening, is provided to the electrical discharge system 91. However, when the primary thickener 107 is optional, the primary sludge leaving the primary clarifier 103 is directly delivered to the electrical discharge system 91.

In operation, the electrical discharge system 91 generates a transient glow-to-arc electric pulse with appropriated voltage and current wave-form through the primary sludge in a spark gap between the electrodes. A fast-changing and strong electric field of prescribed duration and an electro-hydraulic shock wave of prescribed power and intensity that is formed within the sludge under treatment is accompanied by light radiation along with the electro-chemical and physical phenomena described above.

As a result of the discharge of the arcing electric current, the biologic material present within the primary sludge can be broken up and the pathogens are destroyed. After treatment by the electrical discharge system 91 the sterilized primary sludge and the waste active sludge leaving the secondary thickener 108 are transported to the anaerobic digester 106, where they are exposed to microorganisms for anaerobic digestion that further degrade the sludge biologically.

It should be noted that the embodiment shown in FIG. 9 employs the electrical discharge system of the present invention mainly for sterilization of the primary sludge, whereas the waste active sludge remains untreated, which may prevent the expellant from achieving Class "A" level of residual pathogens.

Figure 10A:
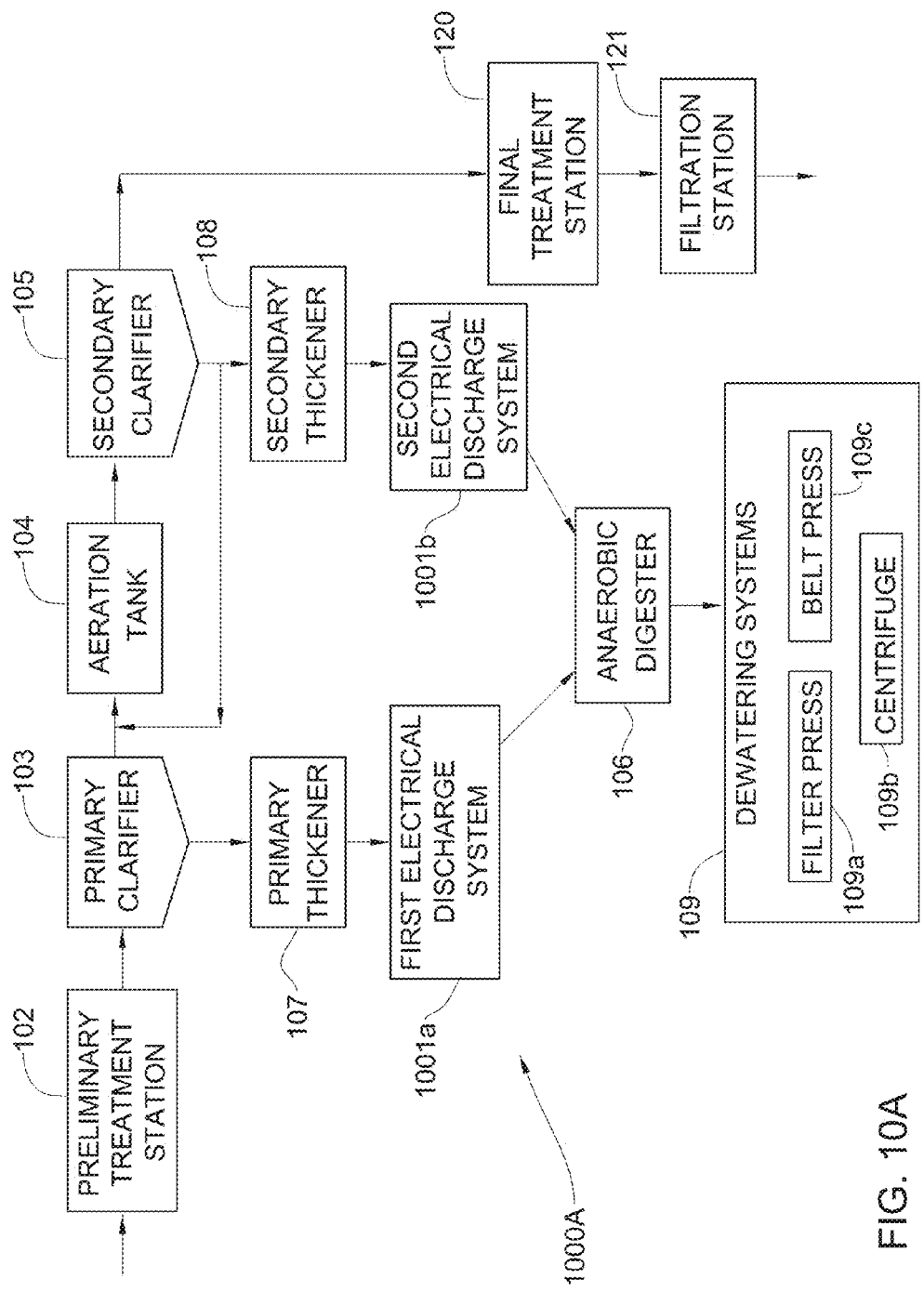

Therefore, an embodiment of the WWTP of the present application, which is illustrated in FIG. 10A, utilizes two individual electrical discharge systems of the present invention for separate treatment of the primary sludge (PS) and the waste activated sludge (WAS). Specifically, as shown in FIG. 10A, the WWTP 1000A differs from the prior art WWTP (100 in FIG. 1) in the fact that in the WWTP 1000A both the primary sludge (PS) leaving the primary clarifier 103 and the waste activated sludge (WAS) leaving the secondary clarifier 105 are treated by pulsed electric discharge at two individual electrical discharge systems of the invention before entering the anaerobic digester 106.

According to the embodiment shown in FIG. 10A, the WWTP 1000A includes a first electrical discharge system 1001a and a second electrical discharge system 1001b. The PS leaving the primary clarifier 103, is treated by the primary thickener 107, and is then fed to first electrical discharge system 1001a. On the other hand, the WAS leaving the primary clarifier 103, is treated by the primary thickener 107, and is then fed to the second electrical discharge system 1001b. The first electrical discharge system 1001a and the second electrical discharge system 1001b can be configured to perform treatment with different electrical parameters, suitable for the best treatment of the PS stream and the WAS stream, correspondingly.

Figure 10B:
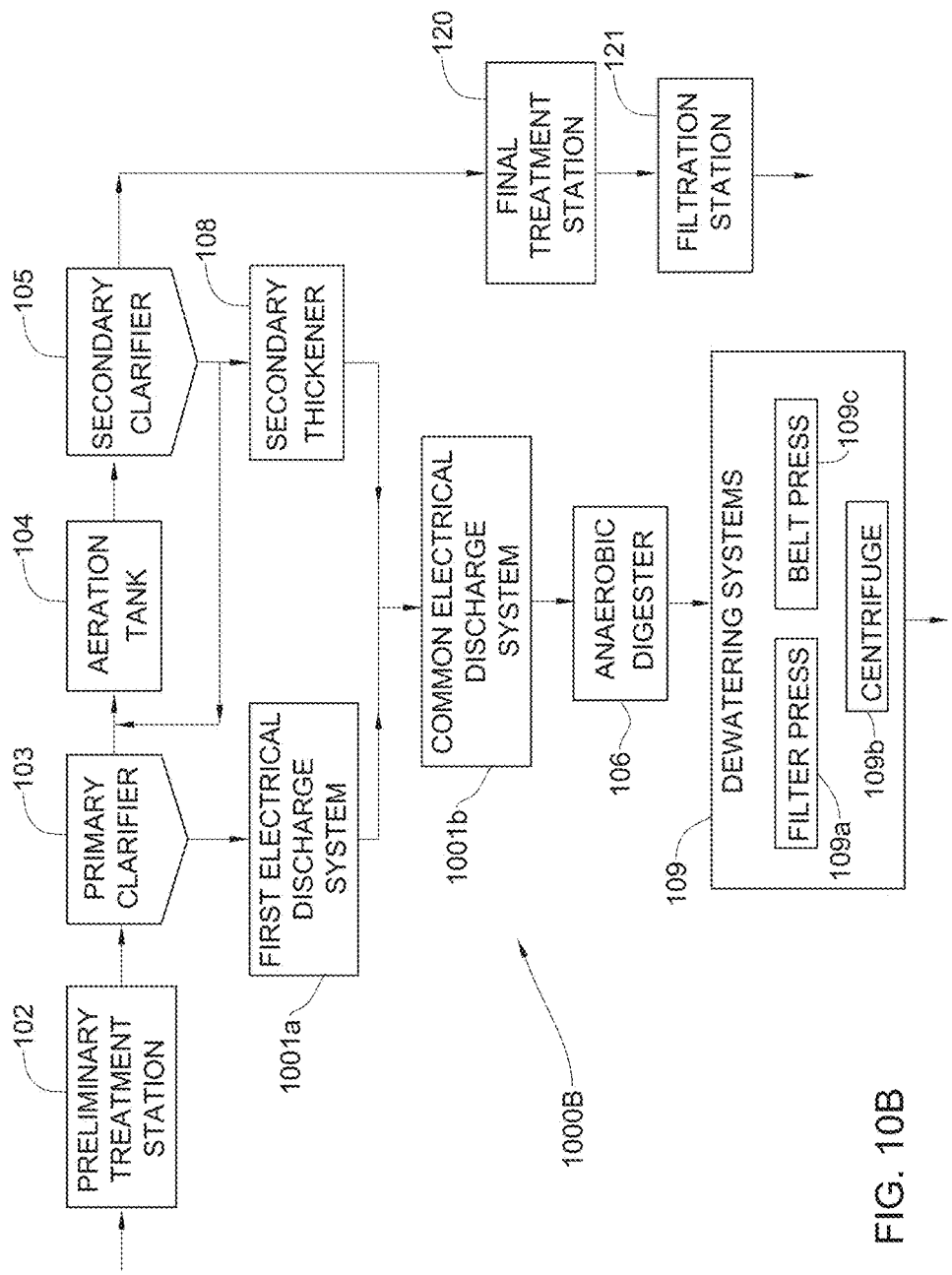

Referring to FIG. 10B, a schematic view of treating of municipal wastewater sludge in a WWTP 1000B is illustrated, according to a further embodiment of the present invention. According to this embodiment, the WWTP 1000B differs from the wastewater treatment plant (1000A in FIG. 10A) in the fact that the PS stream that is discharged from the primary thickener 107, enters the first electrical discharge system 1001a where it is pre-treated to a certain power level. The pre-treated PS stream exiting the 1001a is then mixed with the WAS stream discharged from the secondary thickener 108. Then, the mixed stream is fed to a common discharge system 1001*b* that is operated at a power level suitable for WAS, that also provides the remaining required power level for the pre-treated PS. The PS stream is treated to decompose the relatively large solids, and the organic maters, to disinfect the primary sludge so the further digestion could be faster, with more biogas and less evacuated dry sludge quantities.

Figure 10C:
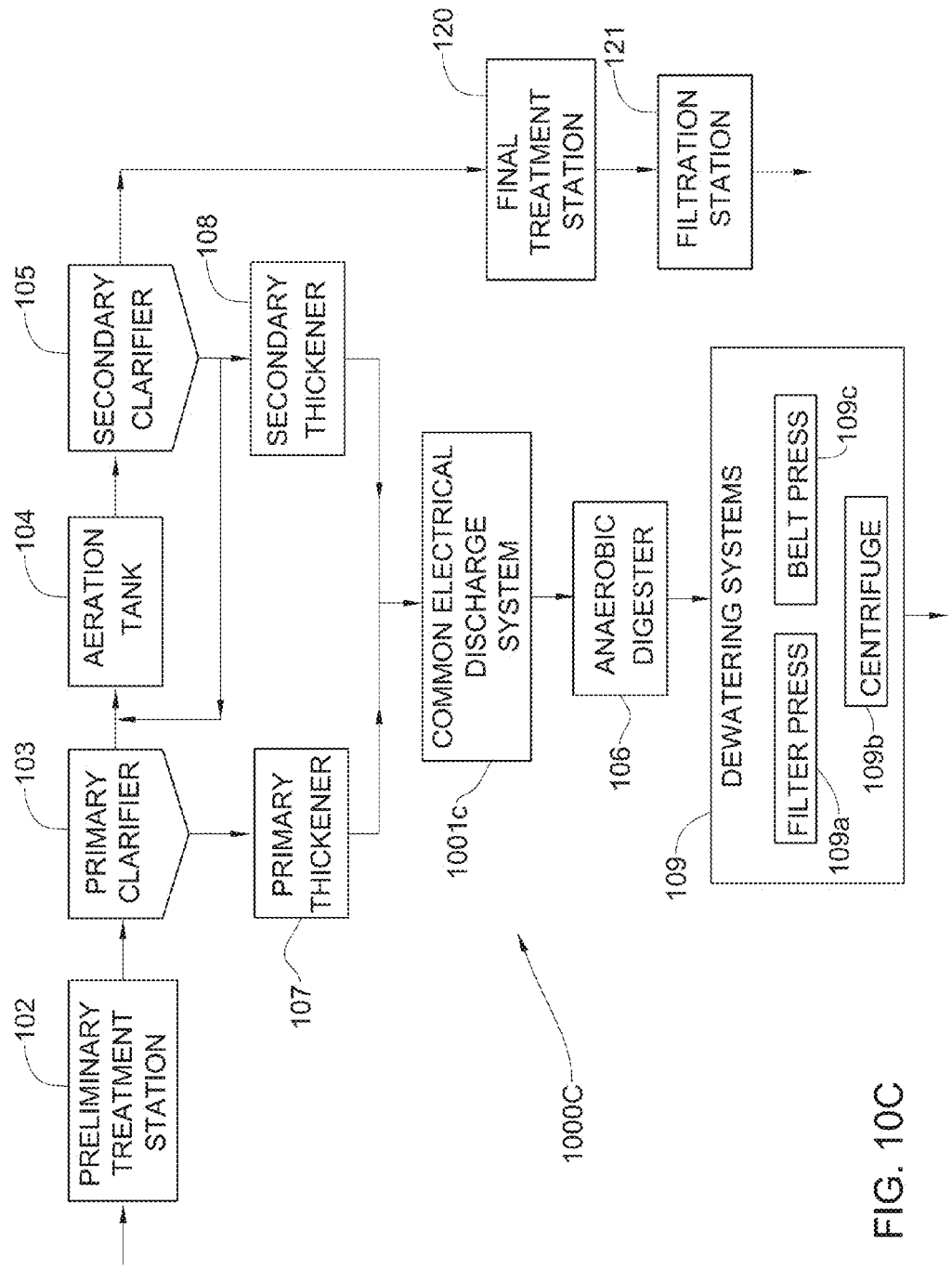

Referring to FIG. 10C, a schematic view of treating of municipal wastewater sludge in a WWTP 1000C is illustrated, according to a further embodiment of the present invention. According to this embodiment, the WWTP 1000C differs from the prior art wastewater treatment plant (100 in FIG. 1) in the fact that the PS stream discharged from the primary thickener 107 and the WAS stream discharged from the secondary thickener 108 are mixed, and then the mixed stream is fed to a common discharge system 1001*c* operated at a higher power level suitable for treatment PS or WAS. When compared to the WWTP 1000B shown in FIG. 10B, since this plant utilizes only a one discharge system, maintenance of this plant is more simple than the maintenance when two discharge systems are used.

Figure 10D:
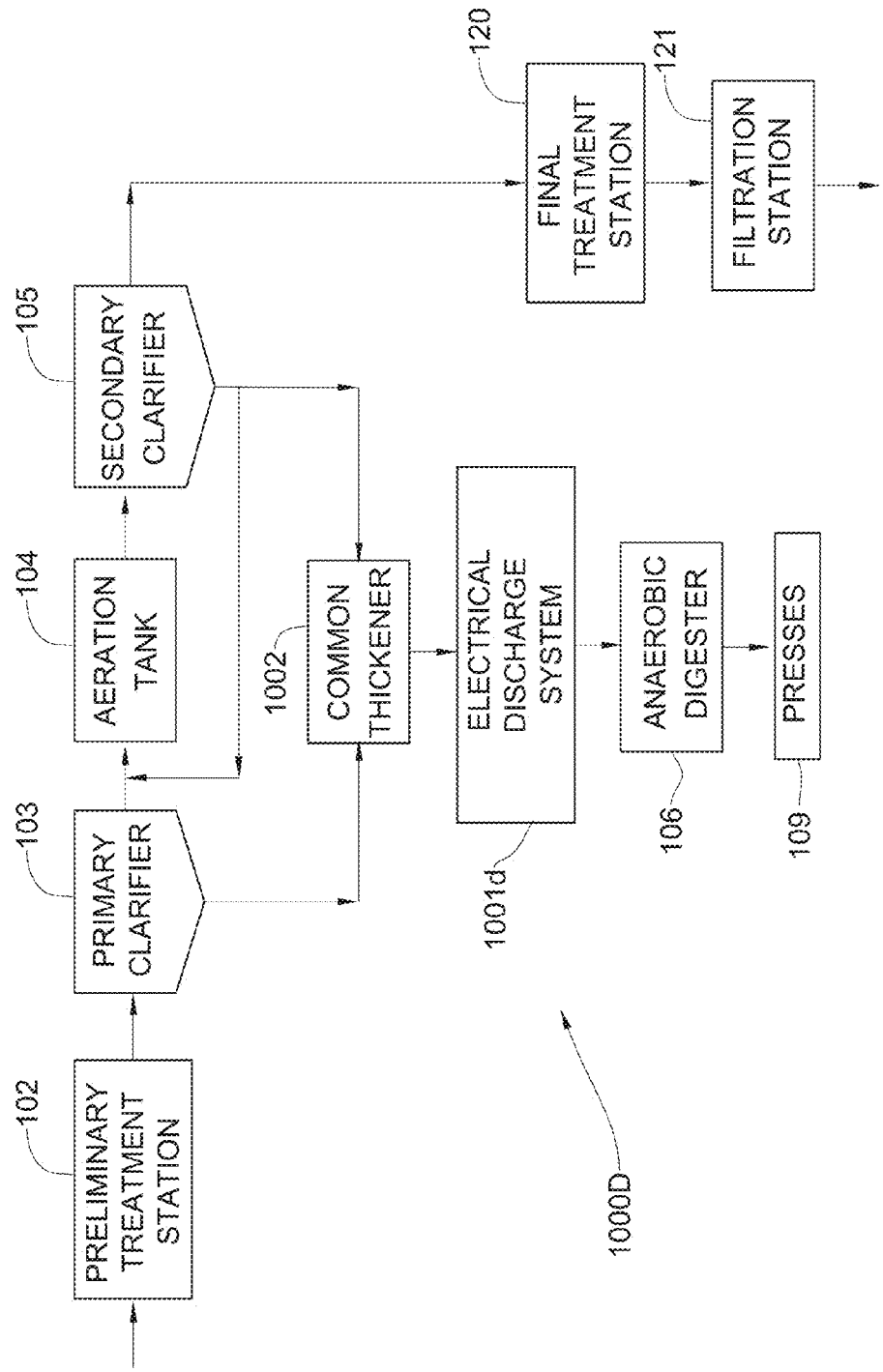

Referring to FIG. 10D, a schematic view of treating of municipal wastewater sludge in a WWTP 1000D is illustrated, according to still a further embodiment of the present invention. According to this embodiment, the WWTP 1000D differs from the prior art wastewater treatment plant (100 in FIG. 1) in the fact that the individual primary and secondary thickeners 107 and 108 are replaced with a single common thickener 1002.

In operation, the primary sludge from primary clarifier 103 and the waste activated sludge (secondary sludge) from secondary clarifier 105 are first delivered to a common thickener 1002 and then the thickened mixture of the primary sludge and the waste activated sludge is transported to a single common electrical discharge system 1001*d* that is arranged downstream of the common thickener 1002 and upstream of the anaerobic digester 106. However, when the common thickener 1002 is optional, and is not included in the wastewater treatment plant, the primary sludge and the waste activated sludge are directly fed to the electrical discharge system 1001*d*.

In operation, the electrical discharge systems generate a transient glow-to-arc electric pulse with appropriated voltage and current wave-form through the sludge in a spark gap between the electrodes. A fast-changing and strong electric field of prescribed duration and an electro-hydraulic shock wave of prescribed power and intensity that is formed within the sludge under treatment is accompanied by electro-chemical reactions, light radiation, and other physical phenomena mentioned herein above.

Due to the discharge of the arcing electric current, the biologic material and the cellular and floc-type organic structures which are present in the sludge mixture can be broken up and destroyed. As a result, the intra-cellular and intercellular water is released and the pathogens are destroyed. After treatment of the sludge mixture by the electrical discharge system(s), the resulting organic solid-contents become readily available as food when the treated sludge mixture is fed to the anaerobic digester 106, where it is exposed to microorganisms for anaerobic digestion that further degrade the sludge biologically.

Figure 11:
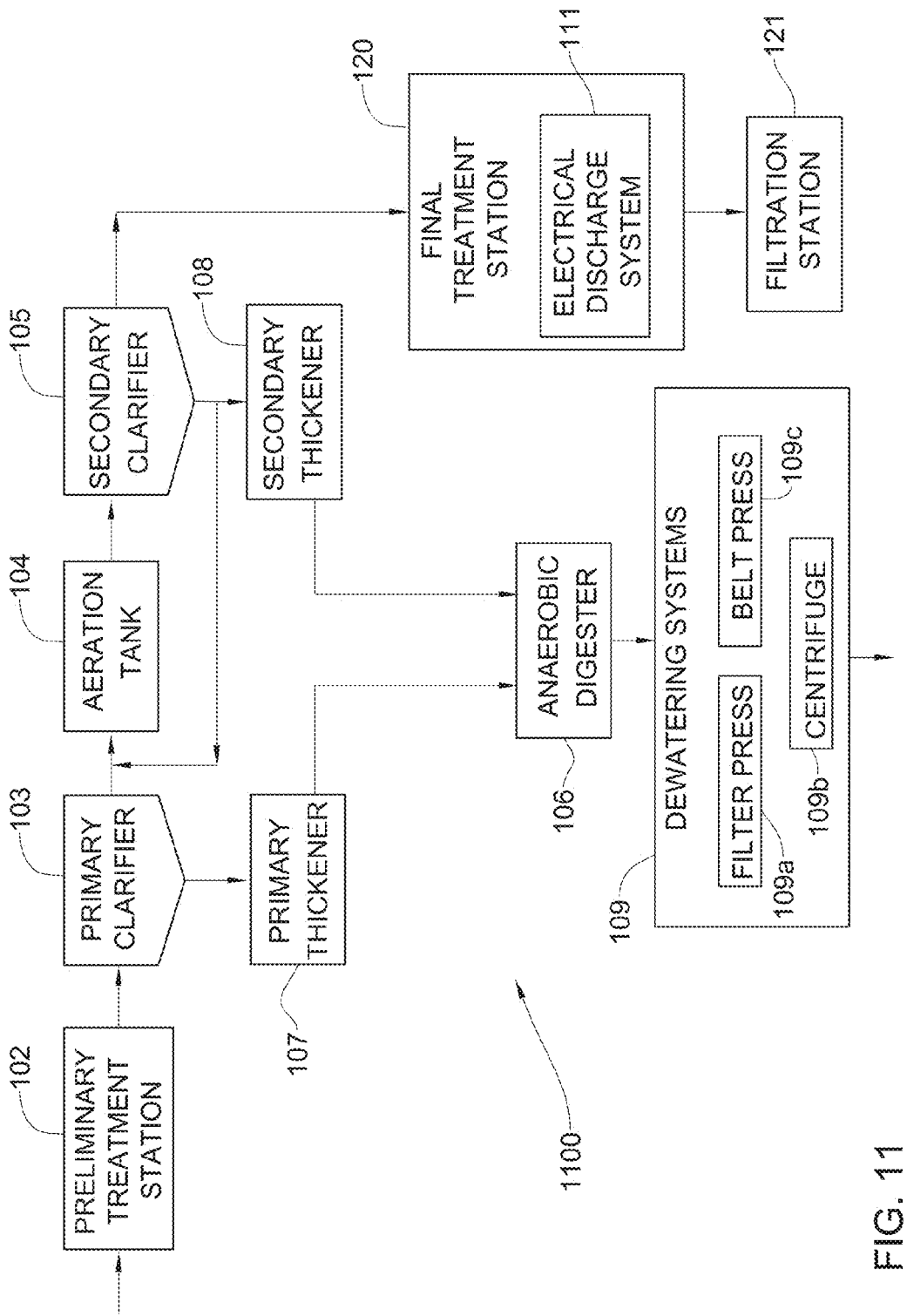

Referring to FIG. 11, a schematic view of treating municipal wastewater sludge in a wastewater treatment plant (WWTP) 1100 is illustrated, according to still another embodiment of the present invention. The WWTP 1100 shown in FIG. 11 differs from the WWTP 80 in FIG. 8 in the fact that an electrical discharge system 111 of the present invention is arranged downstream of the secondary clarifier 105 to receive the secondary wastewater effluent that contains a lesser percentage of bio-solids than WAS. As described above, the secondary wastewater effluent can be heavily polluted and contain pathogenic bacteria and viruses. In order to provide subsequent purification, the secondary effluent is transported to the final treatment station 121. According to the embodiment shown in FIG. 11, the final treatment station 121 includes the electrical discharge system 111 configured for disinfecting the secondary wastewater effluent to destroy the pathogens. The power used by the electrical discharge system 111 can for example be in the range of 0.02 to 0.4 KW per cubic meter of wastewater, depending on the quality of the wastewater.

It should be understood that, when desired, the final treatment station 121 may also include chlorine disinfection and/or involve the use of ultra-violet (UV) light or ozone treatment. All these disinfection processes may be concurrent or consecutive.

It should be noted that the electrical discharge system of the present invention may be of use at one or simultaneously at a number of other different junctions within a wastewater treatment plant instead or in addition to those described above with reference to FIGS. 8 through 11.

Figure 12:
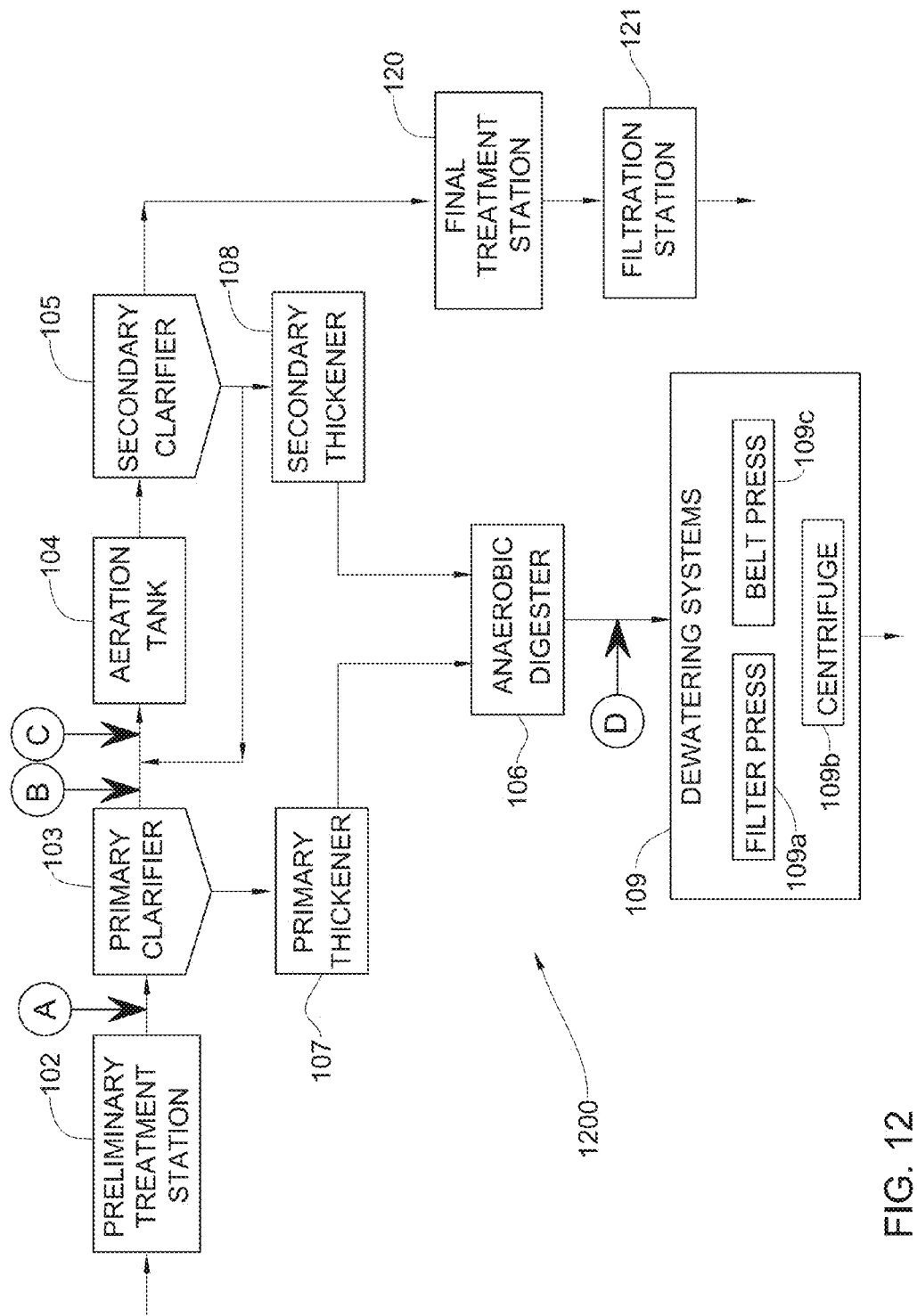
FIG. 12 illustrates a schematic view of a wastewater treatment plant in which an electrical discharge system of the present invention may be used.

FIG. 12 shows a schematic view of a wastewater treatment plant 1200 in which an electrical discharge system of the present invention may be used for additional benefit. Exemplary positions for integration of the electrical discharge system into the plant are marked by reference letters A through D. The electrical discharge system of the present invention may, at each of these positions, handle a portion of the wastewater stream or the entire stream.

For example, the electrical discharge system of the present invention may be arranged upstream of the wastewater stream passing through position A, i.e., after primary treatment station 102 and before the primary clarifier 103. As described above, sand and grit are removed by the primary treatment station 102. Thus, application of the electrical discharge system can liberate bound water from grind particles and flocs, so that efficiency of primary clarifier 103 improves.

Alternatively, the electrical discharge system of the present invention may be arranged downstream of the primary treatment station 102 to receive the wastewater sludge leaving the primary clarifier 103 before it is combined with the return activated sludge (position B), or after it is combined with the return activated sludge (position C). This provision can aid the aeration process and change the bacterial ratios in the aeration tank 104 by eliminating or minimizing harmful bacteria entering it.

As a further alternative, the electrical discharge system of the present invention may be arranged downstream of the anaerobic digester 106 (position D) to receive the digestate (product of the anaerobic digester 106). Application of the electrical discharge to grind particles and flocs can liberate bound water so that efficiency of dewatering presses 109 is improved. Likewise, it further disinfects the digestate to meet Class "A" level before its dewatering, resulting in Class "A" expellant safe for sale or used as fertilizer.

It was found that a concentration of water in the "dry" solid material after the treatment of the digestate by the electrical discharge system of the present invention can be reduced by about 30-40 weight %, when compared to the prior art plant (100 in FIG. 1) that does not employ an electrical discharge system. This reduces the volume of expellant that needs to be trucked off, and reduces the fuel required for its incineration, should it remain unsafe (Class "B" in terms of pathogens, viruses and parasites contained within) as it does in the prior art plant.

It was also found that when the treating energy applied to the digestate was greater than 800 kilowatt-hours per dry ton, the digestate was transformed into a safe Class "A" bio-solids waste material (under EPA 503 regulations).

As such, those skilled in the art to which the present invention pertains, can appreciate that while the present invention has been described in terms of preferred embodiments, the conception, upon which this disclosure is based, may readily be utilized as a basis for the designing of other structures systems and processes for carrying out the several purposes of the present invention.

It is to be understood that the phraseology and terminology employed herein are for the purpose of description and should not be regarded as limiting.

It should be noted that the words "comprising" and "including" as used throughout the appended claims is to be interpreted to mean "including but not limited to".

It is important, therefore, that the scope of the invention is not construed as being limited by the illustrative embodiments set forth herein. Other variations are possible within the scope of the present invention as defined in the appended claims Other combinations and sub-combinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present description.

The invention claimed is:

1. A wastewater treatment plant (WWTP) comprising:
    a preliminary treatment station configured for receiving a wastewater fluid and screening thereof to prevent larger objects from passing further downstream;
    a primary settling clarifier arranged downstream of the preliminary treatment station and configured for receiving the wastewater fluid leaving the preliminary treatment station, and separating it into a primary sludge and a primary effluent;
    an aeration tank configured for receiving the primary effluent leaving the primary settling clarifier, and treating said primary effluent in the presence of air pumped into the aeration tank, thereby to produce an aerated wastewater effluent;
    a secondary settling clarifier arranged downstream of the aeration tank, and configured for receiving the aerated wastewater effluent leaving the aeration tank, and separating it into waste activated sludge and a secondary wastewater effluent;
    an electrical discharge system configured for (i) receiving at least a part of the wastewater fluid selected from said primary sludge and said waste activated sludge, and (ii) generating a glow-to-arc voltage transient arcing electric current pulse through said at least a part of the wastewater fluid to create an electro-hydraulic shock wave within said at least a part of the wastewater fluid accompanied by a high electric field, intensive heat and light radiation; and
    an anaerobic digester arranged downstream of the electrical discharge system configured for receiving said at least a part of the wastewater fluid treated by the electrical discharge system and further degrading it by anaerobic digestion, thereby to provide by-product gases and digestate.

2. The WWTP of claim 1, wherein said electrical discharge system comprises:
    a high voltage supply device having at least one potential terminal and a ground terminal;
    a general capacitor bank coupled to the high voltage supply device;
    at least one general switch connected to the general capacitor bank;
    at least one pulse forming bank coupled to the general capacitor bank through the general switch;
    at least one working switch arranged in series with the corresponding pulse forming bank;
    at least one potential electrode immersed in said at least one wastewater fluid and coupled to said at least one pulse forming bank through said at least one working switch; and
    at least one another electrode selected from a grounded electrode and another voltage electrode, said at least one another electrode defining together with said at least one potential electrode an arcing spark gap within said at least a part of the wastewater fluid, said at least one another electrode being arranged in series with the working switch for providing an arcing electric discharge through a portion of said at least a part of the wastewater fluid in the arcing spark gap.

3. The WWTP of claim 2, wherein said electrical discharge system comprises at least two pulse forming banks; said at least two pulse forming banks being separated from each other by a working current resistive element configured to minimize current flow between said at least two pulse forming banks during their transient discharge.

4. The WWTP of claim 2, wherein the general capacitor bank and said at least one pulse forming bank are connected together by a common grounded bus coupled to the grounded terminal of the high-voltage supply device.

5. The WWTP of claim 2, wherein said electrical discharge system further includes at least one general limiting resister arranged in a grounded electric line to separate the general capacitor bank from said at least one pulse forming bank.

6. The WWTP of claim 2, wherein said at least one general switch and said at least one working switch are three electrode spark-gap switches including two switching electrodes forming switching paths and a trigger electrode configured for providing passage of high current between the two switching electrodes.

7. The WWTP of claim 2, wherein said at least one working switch is semiconductor high current switch.

8. The WWTP of claim 2, wherein said at least one general switch and said at least one working switch are three-electrode spark-gap switches including two switching electrodes forming switching paths and a mechanical moving contact providing making and breaking of high current between the two switching electrodes.

9. The WWTP of claim 2, wherein said electrical discharge system further comprises:
    an additional general switch connected to the general capacitor bank;
    at least one additional pulse forming bank having a grounded terminal and a potential terminal coupled to the general capacitor bank through the additional general switch; and
    at least one additional working switch arranged in series with and between the potential terminal of the corresponding additional pulse forming bank and the corresponding electrode that is immersed into the liquid under treatment.

10. The WWTP of claim 9, wherein said electrical discharge system comprises at least two said additional pulse forming banks, wherein said additional pulse forming banks are separated from each other by an additional current resistive element arranged in a potential power line.

11. The WWTP of claim 9, wherein an additional electrical capacity ($C_{add}$) of the additional capacitor bank is greater than an electrical capacitance ($C_w$) of the pulse forming bank, but lower than a capacitance ($C_g$) of the general capacitor bank.

12. The WWTP of claim 2, wherein said electrical discharge system comprises a treatment vessel containing the liquid under treatment and equipped with at least one pair of said at least one potential electrode and at least one other electrode positioned to form at least one gap to provide at least one arc channel for transferring a glow-to-arc pulse through the liquid under treatment.

13. The WWTP of claim 12, wherein said treatment vessel comprises a plurality of electrode pairs operating in unison to provide a plurality of arc channels forming an interference pattern of reflections of hydraulic shock waves.

14. The WWTP of claim 12, wherein said treatment vessel comprises an internal reflector configured to reflect, to direct and to resonate hydraulic shock waves, wherein said internal reflector has an ellipsoidal shape, and wherein said arcing spark gap is located at least in one focal node of the ellipsoidal reflector.

15. The WWTP of claim 12, wherein said treatment vessel comprises an internal reflector configured to reflect, to direct and to resonate hydraulic shock waves, wherein said internal reflector has a spheroidal shape, and wherein said arcing spark gap is located at least in one position on a circle passing through focal nodes of the spheroidal reflector around a spheroid axis.

16. The WWTP of claim 12, wherein said treatment vessel comprises an internal reflector configured to reflect, to direct and to resonate hydraulic shock waves, wherein said internal reflector has a cylindrical tubular shape, and wherein at least one said arcing spark gap is located on a longitudinal tube axis of the cylindrical reflector.

17. The WWTP of claim 12, wherein said treatment vessel comprises an internal reflector configured to reflect, to direct and to resonate hydraulic shock waves, wherein said internal reflector has a cylindrical tubular shape, and wherein at least one arcing spark gap is located on a helix turning around a longitudinal tube axis of the cylindrical reflector.

18. The WWTP of claim 12, wherein said treatment vessel comprises an internal reflector configured to reflect, to direct and to resonate hydraulic shock waves, wherein said internal reflector has an elliptical tubular shape, and wherein at least one said arcing spark gap is located along an axis formed by focal nodes of the elliptical reflector.

19. The WWTP of claim 12, wherein said treatment vessel comprises at least one internal optic device configured to direct, to split, and to focus said hydraulic shock waves.

20. The WWTP of claim 12, wherein the said treatment vessel comprises an inlet gas manifold, a blower fan providing a flow of air or a gas mixture containing oxygen to pass through the manifold, and a nozzle arranged at an end of the inlet gas manifold, and configured for allowing a gas stream to be mixed with the wastewater stream.

21. The WWTP of claim 1, further comprising another electrical discharge system configured for receiving secondary wastewater effluent and generating a glow-to-arc transient voltage and transient arcing electric current pulse through said secondary wastewater effluent to create an electro-hydraulic shock wave within said secondary wastewater effluent accompanied by a high electric field, intensive heat and light radiation.

22. The WWTP of claim 1, further comprising another electrical discharge system arranged upstream of the primary treatment station and configured for receiving and treating said wastewater fluid and providing it after the treatment to the preliminary treatment station.

23. The WWTP of claim 1, further comprising another electrical discharge system arranged downstream of the primary treatment station and configured for receiving and treating the wastewater sludge effluent leaving the primary treatment station.

24. The WWTP of claim 1, further comprising another electrical discharge system arranged downstream of the anaerobic digester and configured for receiving and treating the digestate.

25. A method for treatment of wastewater fluid at the wastewater treatment plant (WWTP) of claim 1, the method comprising:
   receiving a wastewater fluid by said preliminary treatment station and screening thereof to prevent larger objects from passing further downstream;
   receiving the wastewater fluid leaving the preliminary treatment station by said primary settling clarifier, and separating it into a primary sludge and a primary effluent;
   receiving the primary effluent leaving the primary settling clarifier by said aeration tank, and treating said primary effluent in the presence of air pumped into the aeration tank to produce an aerated wastewater effluent;
   receiving the aerated wastewater effluent leaving the aeration tank by said secondary settling clarifier, and separating it into waste activated sludge and a secondary wastewater effluent;
   receiving at least a part of the wastewater fluid selected from said primary sludge and said waste activated sludge by said electrical discharge system, and generating a glow-to-arc transient arcing electric current pulse through said at least a part of the wastewater fluid to create an electro-hydraulic shock wave within said at least a part of the wastewater fluid accompanied by high electric field, intensive heat and light radiation; and
   receiving said at least a part of the wastewater fluid treated by said at least one electrical discharge system by said anaerobic digester, and further degrading it by anaerobic digestion, thereby to provide by-product gases and digestate.

26. The method for treatment of the wastewater fluid of claim 25,
   wherein said electrical discharge system comprises:
   a high voltage supply device having at least one potential terminal and a ground terminal;
   a general capacitor bank coupled to the high voltage supply device;
   at least one general switch connected to the general capacitor bank;
   at least one pulse forming bank coupled to the general capacitor bank through the general switch;
   at least one working switch arranged in series with the corresponding pulse forming bank;
   at least one potential electrode immersed in said least one wastewater fluid and coupled to said at least one pulse forming bank through said at least one working switch; and at least one another electrode selected from a grounded electrode and another voltage electrode, said at least one another electrode defining together with said at least one potential electrode an arcing spark gap within said at least a part of the wastewater fluid, said at least one another electrode being arranged in series with the working switch for providing an arcing electric discharge through a portion of said at least a part of the wastewater fluid in the arcing spark gap, and wherein said generating of the glow-to-arc transient arcing electric current pulse by said electrical discharge system comprises:

placing said at least one general switch and said at least one working switch in the switched off position;

charging the general capacitor bank by connecting to the voltage supply device; switching on said at least one general switch to supply a high voltage to said at least one pulse forming bank for charging thereof by partially discharging the general capacitor bank; and switching on said at least one working switch, thereby discharging said at least one pulse forming bank and generating a transient voltage and electric current pulse between said at least one potential electrode and said at least one grounded electrode.

27. The method of claim 25, comprising the step of switching off said at least one general switch to break a connection between the general capacitor bank and said at least one pulse forming bank before the step of switching on said at least one working switch.

28. The method of claim 25, further comprising:

providing an additional general switch and connecting it to the general capacitor bank;

providing at least one additional pulse forming bank having a grounded terminal and a potential terminal, coupling the ground terminal to the ground, and coupling the potential terminal to the general capacitor bank through the additional general switch, and immersing the potential terminal into said at least a part of the wastewater fluid under treatment;

providing at least one additional working switch and arranging it in series with and between the potential terminal of the corresponding additional pulse forming bank and the potential terminal that is immersed into said at least a part of the wastewater fluid under treatment;

switching on said additional general switch to supply a high voltage to said at least one additional pulse forming bank for charging thereof by partially discharging the general capacitor bank; and switching on said at least one additional working switch to provide discharge of said at least one additional pulse forming bank and thereby to maintain an arcing transient electric current between the potential terminal and the grounded terminal.

* * * * *